(12) United States Patent
Joo et al.

(10) Patent No.: US 11,742,052 B2
(45) Date of Patent: Aug. 29, 2023

(54) NONVOLATILE MEMORY DEVICE AND STORAGE DEVICE INCLUDING NONVOLATILE MEMORY DEVICE

(71) Applicant: Samsung Electronics Co., Ltd., Suwon-si (KR)

(72) Inventors: Sang-Hyun Joo, Suwon-si (KR); Tae-Min Park, Hwaseong-si (KR); Hyungsoo Kim, Seoul (KR); Jaewoo Im, Yongin-si (KR); Won-Taeck Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 177 days.

(21) Appl. No.: 17/319,493

(22) Filed: May 13, 2021

(65) Prior Publication Data
US 2022/0093206 A1    Mar. 24, 2022

(30) Foreign Application Priority Data

Sep. 21, 2020   (KR) ......................... 10-2020-0121631

(51) Int. Cl.
*G11C 29/50*      (2006.01)
*G11C 16/04*      (2006.01)
(Continued)

(52) U.S. Cl.
CPC .... *G11C 29/50004* (2013.01); *G11C 16/0483* (2013.01); *G11C 16/08* (2013.01);
(Continued)

(58) Field of Classification Search
CPC .......... G11C 29/50004; G11C 16/0483; G11C 16/08; G11C 16/10; G11C 16/24;
(Continued)

(56) References Cited

U.S. PATENT DOCUMENTS 5,748,545 A    5/1998  Lee et al.
6,407,953 B1   6/2002  Cleeves
(Continued)

FOREIGN PATENT DOCUMENTS

KR    10-1650227 B1    8/2016
KR    10-2161738 B1    10/2020
KR    10-2170975 B1    10/2020

*Primary Examiner* — Kyle Vallecillo
(74) *Attorney, Agent, or Firm* — Harness, Dickey & Pierce, P.L.C.

(57) ABSTRACT

Disclosed is a nonvolatile memory device, which includes a memory cell array including cell strings, a row decoder connected with a ground selection transistor of each of the cell strings through a ground selection line, connected with memory cells of each of the cell strings through word lines, and connected with a string selection transistor of each of the cell strings through a string selection line, and a page buffer connected with the cell strings through bit lines. In a first period of a check operation, the page buffer applies a first bias voltage to the bit lines, and the row decoder applies a turn-off voltage to the ground selection line, a turn-on voltage to the string selection line, and a first check voltage to the word lines. In a second period of the check operation, the page buffer senses first changes of voltages of the bit lines.

20 Claims, 16 Drawing Sheets

(51) Int. Cl.
*G11C 16/08* (2006.01)
*G11C 16/10* (2006.01)
*G11C 16/24* (2006.01)
*G11C 16/34* (2006.01)
*H01L 27/11556* (2017.01)
*H01L 27/11582* (2017.01)
*H01L 25/065* (2023.01)
*H01L 25/18* (2023.01)
*H01L 23/00* (2006.01)
*H10B 41/27* (2023.01)
*H10B 43/27* (2023.01)

(52) U.S. Cl.
CPC .............. *G11C 16/10* (2013.01); *G11C 16/24* (2013.01); *G11C 16/3459* (2013.01); *H01L 24/08* (2013.01); *H01L 25/0657* (2013.01); *H01L 25/18* (2013.01); *H10B 41/27* (2023.02); *H10B 43/27* (2023.02); *G11C 2029/5004* (2013.01); *H01L 2224/08145* (2013.01); *H01L 2924/1431* (2013.01); *H01L 2924/14511* (2013.01)

(58) Field of Classification Search
CPC ........ G11C 16/3459; G11C 2029/5004; H10B 41/27; H10B 43/27; H01L 24/08; H01L 25/0657; H01L 25/18; H01L 2224/08145; H01L 2924/1431; H01L 2924/14511
See application file for complete search history.

(56) References Cited

U.S. PATENT DOCUMENTS

| | | |
|---|---|---|
| 6,553,510 B1 | 4/2003 | Pekny |
| 7,106,639 B2 | 9/2006 | Taussig et al. |
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,656,738 B2 | 2/2014 | Joseph, II et al. |
| 9,025,378 B2 | 5/2015 | Tokiwa |
| 9,165,683 B2 | 10/2015 | Tam |
| 9,224,495 B2 | 12/2015 | Jung et al. |
| 9,330,789 B2 | 5/2016 | Tanzawa |
| 9,437,321 B2 | 9/2016 | Tseng et al. |
| 9,530,514 B1 | 12/2016 | Sabde et al. |
| 9,646,696 B2 | 5/2017 | Yang |
| 9,653,175 B2 | 5/2017 | Sabde et al. |
| 9,812,214 B2 | 11/2017 | Shim et al. |
| 9,842,659 B2 | 12/2017 | Nam et al. |
| 10,340,017 B2 | 7/2019 | Ku et al. |
| 10,529,435 B2 | 1/2020 | Puthenthermadam et al. |
| 10,593,421 B2 | 3/2020 | Huang |
| 2004/0022092 A1 | 2/2004 | Dvir et al. |
| 2011/0233648 A1 | 9/2011 | Seol et al. |
| 2015/0085576 A1* | 3/2015 | Yoo .................. G11C 16/26 365/185.11 |
| 2019/0130953 A1 | 5/2019 | Lee et al. |
| 2019/0164624 A1 | 5/2019 | Jung |
| 2019/0198514 A1 | 6/2019 | Kim et al. |
| 2020/0105347 A1 | 4/2020 | Nam et al. |
| 2020/0192759 A1* | 6/2020 | Hwang ................. G11C 29/52 |

* cited by examiner

NONVOLATILE MEMORY DEVICE AND STORAGE DEVICE INCLUDING NONVOLATILE MEMORY DEVICE

CROSS-REFERENCE TO RELATED APPLICATIONS

This application claims priority under 35 U.S.C. § 119 to Korean Patent Application No. 10-2020-0121631 filed on Sep. 21, 2020, in the Korean Intellectual Property Office, the disclosures of which are incorporated by reference herein in their entireties.

BACKGROUND

Embodiments of the present disclosure disclosed herein relate to an electronic device, and more particularly, relate to a nonvolatile memory device checking the occurrence of failure and a storage device including the nonvolatile memory device.

A storage device refers to a device, which stores data under control of a host device, such as a computer, a smartphone, or a smart pad. The storage device includes a device, which stores data on a magnetic disk, such as a hard disk drive (HDD), or a device, which stores data in a semiconductor memory, in particular, a nonvolatile memory, such as a solid state drive (SSD) or a memory card.

A nonvolatile memory includes a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

As semiconductor manufacturing technologies develop, the degree of integration and a volume of the storage device continue to increase. The higher degree of integration of the storage device makes it possible to reduce costs necessary to manufacture the storage device. However, the higher degree of integration of the storage device causes a scale-down and a structure change of the storage device, thereby causing various new issues. The issues cause a damage of data stored in the storage device, thereby making the reliability of the storage device lower. There is a continuous demand on a method and a device capable of improving the reliability of the storage device.

SUMMARY

Embodiments of the present disclosure provide a nonvolatile memory device checking whether a failure occurs at the nonvolatile memory of a vertical structure and a storage device including the nonvolatile memory device.

According to example embodiments, a nonvolatile memory device includes a memory cell array including cell strings, wherein each of the cell strings includes a ground selection transistor, memory cells, and a string selection transistor stacked in a direction perpendicular to a substrate, a row decoder connected with the ground selection transistor of each of the cell strings through a ground selection line, connected with the memory cells of each of the cell strings through word lines, and connected with the string selection transistor of each of the cell strings through a string selection line, and a page buffer connected with the cell strings through bit lines. In a first period of a check operation, the page buffer applies a first bias voltage to the bit lines. In the first period of the check operation, the row decoder applies a turn-off voltage to the ground selection line, applies a turn-on voltage to the string selection line, and applies a first check voltage to the word lines. In a second period of the check operation, the page buffer senses first changes of voltages of the bit lines. In the second period of the check operation, a status fail signal is output in response to that the first changes of the voltages of the bit lines are sensed.

According to example embodiments, a storage device includes a nonvolatile memory device including cell strings, wherein each of the cell strings includes a ground selection transistor, memory cells, and a string selection transistor stacked on a substrate in a direction perpendicular to the substrate, and a controller transferring a command to the nonvolatile memory device. The nonvolatile memory device performs a check operation in response to the command. The check operation includes a first period of applying a bias voltage to bit lines connected with the cell strings, applying a turn-off voltage to a ground selection line connected with the ground selection transistor of each of the cell strings, applying a turn-on voltage to a string selection line connected with the string selection transistor of each of the cell strings, and applying a check voltage to word lines connected with the memory cells of each of the cell strings, and a second period of sensing changes of voltages of the bit lines.

According to example embodiments, a nonvolatile memory device includes a peripheral region, and a memory cell region. The memory cell region includes first metal pads, and a memory cell array including cell strings, wherein each of the cell strings includes a ground selection transistor, memory cells, and a string selection transistor stacked on a substrate in a direction perpendicular to the substrate. The peripheral region includes second metal pads, a row decoder connected with the ground selection transistor of each of the cell strings through a ground selection line, connected with the memory cells of each of the cell strings through word lines, and connected with the string selection transistor of each of the cell strings through a string selection line, and a page buffer connected with the cell strings through bit lines. The peripheral region is vertically connected by the first metal pads and the second metal pads. In a first period of a check operation, the page buffer applies a bias voltage to the bit lines. In the first period of the check operation, the row decoder applies a turn-off voltage to the ground selection line, applies a turn-on voltage to the string selection line, and applies a check voltage to the word lines. In a second period of the check operation, the page buffer senses changes of voltages of the bit lines. In the second period of the check operation, a status fail signal is output in response to that the changes of the voltages of the bit lines are sensed.

BRIEF DESCRIPTION OF THE FIGURES

The above and other objects and features of the present disclosure will become apparent by describing in detail example embodiments thereof with reference to the accompanying drawings.

DETAILED DESCRIPTION

Below, example embodiments of the present disclosure may be described in detail and clearly to such an extent that an ordinary one in the art easily implements the present disclosure.

Figure 1:
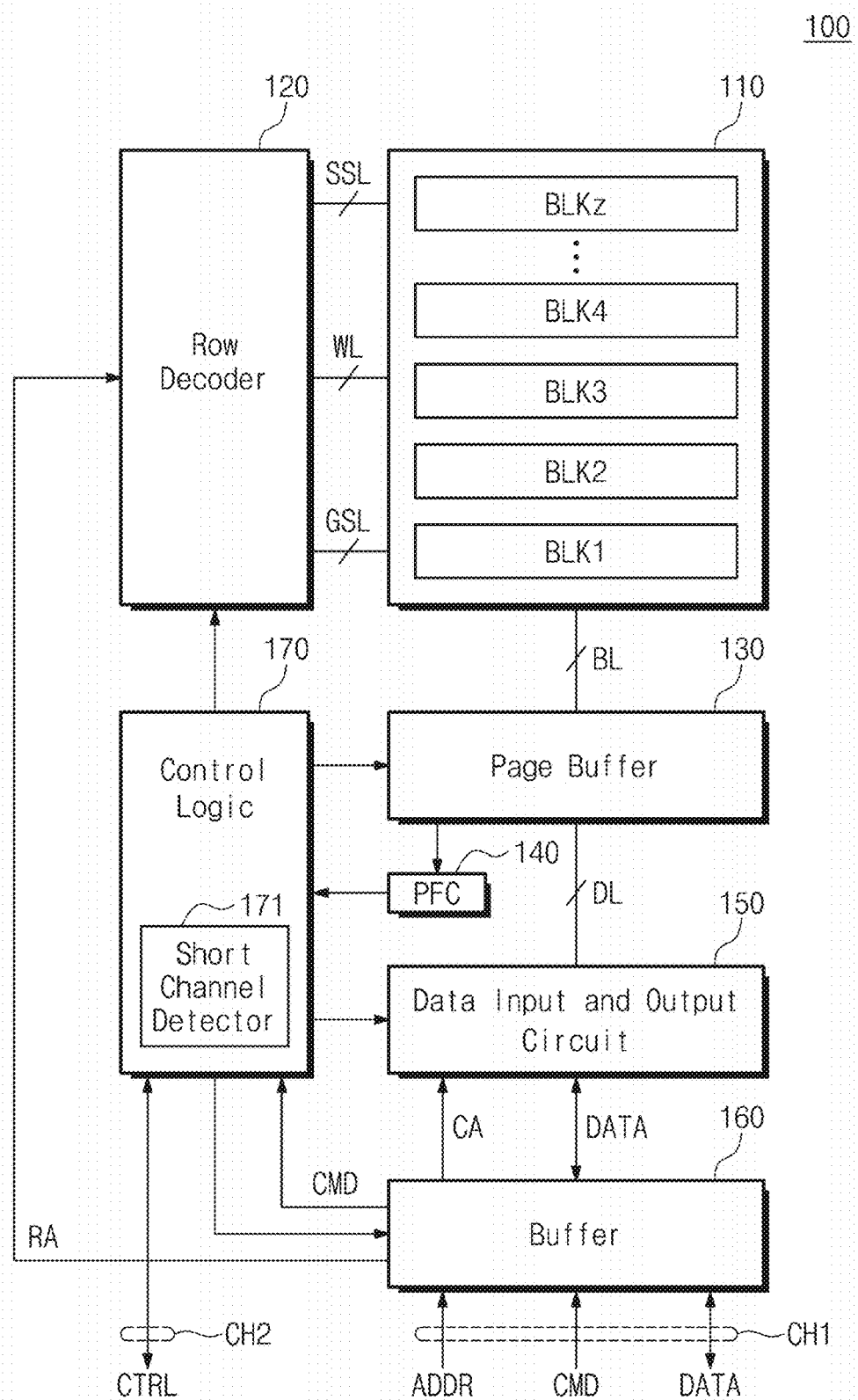
FIG. 1 is a block diagram illustrating a nonvolatile memory device according to example embodiments of the present disclosure.

FIG. 1 is a block diagram illustrating a nonvolatile memory device 100 according to example embodiments of the present disclosure. Referring to FIG. 1, the nonvolatile memory device 100 includes a memory cell array 110, a row decoder 120, a page buffer 130, a pass/fail check block (PFC) 140, a data input and output circuit 150, a buffer 160, and/or a control logic 170.

The memory cell array 110 includes a plurality of memory blocks BLK1 to BLKz. Each of the memory blocks BLK1 to BLKz includes a plurality of memory cells. Each of the memory blocks BLK1 to BLKz may be connected with the row decoder 120 through a ground selection line(s) GSL, word lines WL, and a string selection line(s) SSL. Some of the word lines WL may be used as dummy word lines. Each of the memory blocks BLK1 to BLKz may be connected with the page buffer 130 through a plurality of bit lines BL. The plurality of memory blocks BLK1 to BLKz may be connected in common with the plurality of bit lines BL.

In example embodiments, each of the plurality of memory blocks BLK1 to BLKz may be a unit of an erase operation. The memory cells belonging to each of the memory blocks BLK1 to BLKz may be erased at the same time. For another example, each of the plurality of memory blocks BLK1 to BLKz may be divided into a plurality of sub-blocks. Each of the plurality of sub-blocks may correspond to a unit of an erase operation.

The row decoder 120 is connected with the memory cell array 110 through the ground selection lines GSL, the word lines WL, and the string selection lines SSL. The row decoder 120 operates under control of the control logic 170.

The row decoder 120 may decode a row address RA received from the buffer 160 and may control voltages to be applied to the string selection lines SSL, the word lines WL, and the ground selection lines GSL based on the decoded row address.

The page buffer 130 is connected with the memory cell array 110 through the plurality of bit lines BL. The page buffer 130 is connected with the data input and output circuit 150 through a plurality of data lines DL. The page buffer 130 operates under control of the control logic 170.

In a program operation, the page buffer 130 may store data to be written in memory cells. The page buffer 130 may apply voltages to the plurality of bit lines BL based on the stored data. In a read operation or in a verify read operation that is performed in the program operation or the erase operation, the page buffer 130 may sense voltages of the bit lines BL and may store the sensing result.

In the verify read operation associated with the program operation or the erase operation, the pass/fail check block 140 may verify the sensing result of the page buffer 130. For example, in the verify read operation associated with the program operation, the pass/fail check block 140 may count the number of values (e.g., "0") respectively corresponding to on-cells that are not programmed to a target threshold voltage or more.

In the verify read operation associated with the erase operation, the pass/fail check block 140 may count the number of values (e.g., "1") respectively corresponding to off-cells that are not erased to a target threshold voltage or less. When the counted result is a threshold value or more, the pass/fail check block 140 may output a fail signal to the control logic 170. When the counted result is smaller than the threshold value, the pass/fail check block 140 may output a pass signal to the control logic 170. Depending on a result of the verification of the pass/fail check block 140, a program loop of the program operation may be further performed, or an erase loop of the erase operation may be further performed.

The data input and output circuit 150 is connected with the page buffer 130 through the plurality of data lines DL. The data input and output circuit 150 may receive a column address CA from the buffer 160. The data input and output circuit 150 may output data read by the page buffer 130 to the buffer 160 depending on the column address CA. The data input and output circuit 150 may provide data received from the buffer 160 to the page buffer 130, based on the column address CA.

The buffer 160 may receive a command CMD and an address ADDR from an external device through a first channel CH1 and may exchange data "DATA" with the external device. The buffer 160 may operate under control of the control logic 170. The buffer 160 may provide the command CMD to the control logic 170. The buffer 160 may provide the row address RA of the address ADDR to the row decoder 120 and may provide the column address CA of the address ADDR to the data input and output circuit 150. The buffer 160 may exchange the data "DATA" with the data input and output circuit 150.

The control logic 170 may exchange control signals CTRL from the external device through a second channel CH2. The control logic 170 may allow the buffer 160 to route the command CMD, the address ADDR, and the data "DATA". The control logic 170 may decode the command CMD received from the buffer 160 and may control the nonvolatile memory device 100 based on the decoded command.

The control logic 170 may include a short channel detector 171. The short channel detector 171 may perform a check operation in response to a designated command. The check operation may be performed to check whether there occurs a failure that a channel is short-circuited. In response to that the failure that a channel is short-circuited is detected, the control logic 170 may output a status fail signal. The status fail signal may be output in the form of data "DATA" or in the form of a control signal CTRL.

In example embodiments, the nonvolatile memory device 100 may be manufactured in a bonding manner. The memory cell array 110 may be manufactured at a first wafer, and the row decoder 120, the page buffer 130, the data input and output circuit 150, the buffer 160, and the control logic 170 may be manufactured at a second wafer. The nonvolatile memory device 100 may be implemented by coupling the first wafer and the second wafer such that an upper surface of the first wafer and an upper surface of the second wafer face each other.

For another example, the nonvolatile memory device 100 may be manufactured in a cell over peri (COP) manner. The peripheral circuit including the row decoder 120, the page buffer 130, the data input and output circuit 150, the buffer 160, and/or the control logic 170 may be implemented on a substrate. The memory cell array 110 may be implemented over the peripheral circuit. The peripheral circuit and the memory cell array 110 may be connected by using through vias.

Figure 2:
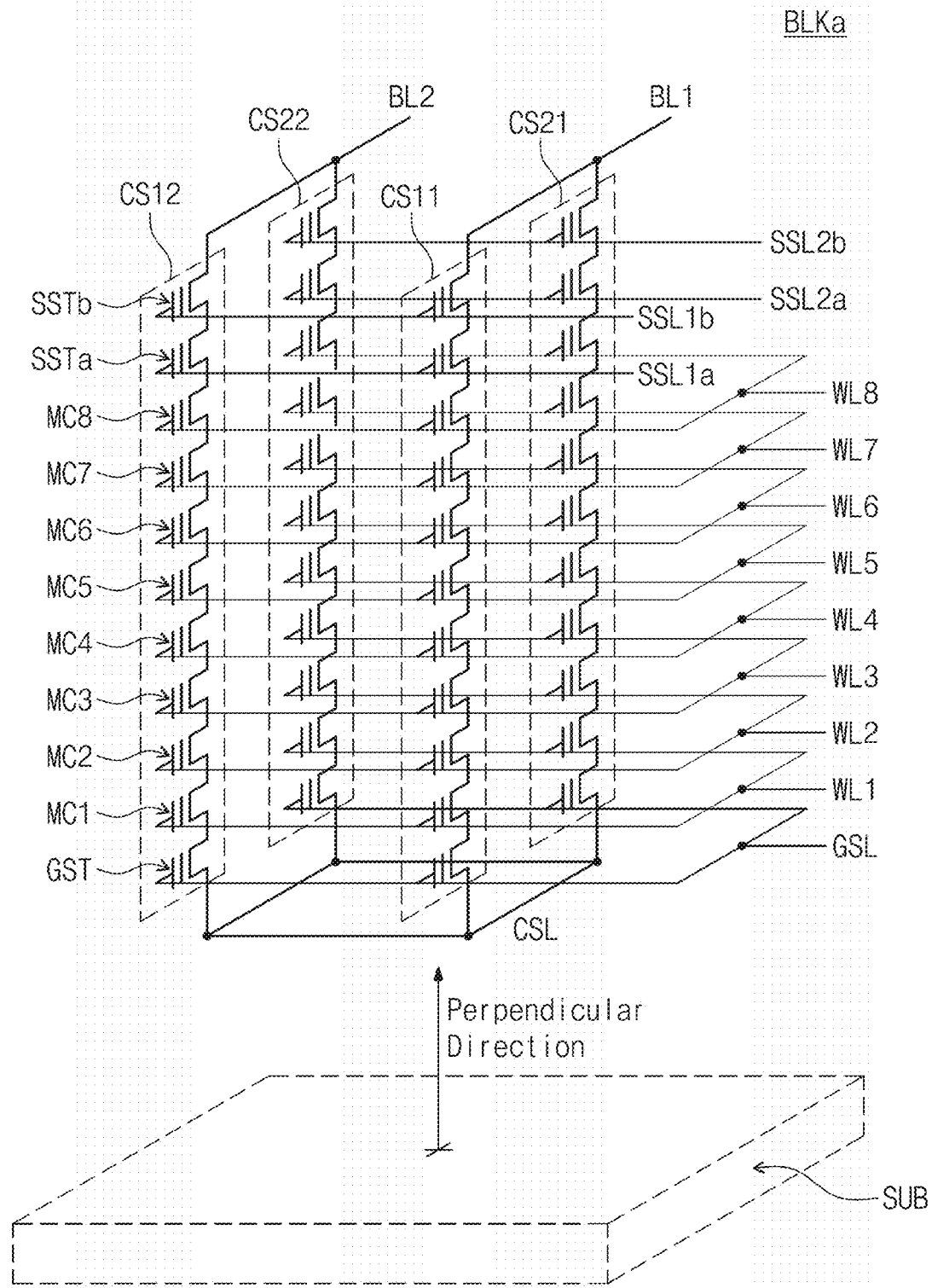
FIG. 2 is a circuit diagram illustrating an example of one memory block of memory blocks of FIG. 1.

FIG. 2 is a circuit diagram of an example of one memory block BLKa of the memory blocks BLK1 to BLKz of FIG. 1. Referring to FIG. 2, a plurality of cell strings CS may be arranged on a substrate SUB in rows and columns. The plurality of cell strings CS may be connected in common with the common source line CSL formed on (or in) a substrate SUB. In FIG. 2, a location of the substrate SUB is illustrated by way of example to help understand a structure of the memory block BLKa.

Cell strings CS of each row may be connected in common with the ground selection line GSL and may be connected with corresponding string selection lines of first and second string selection lines SSL1a, SSL1b, SSL2a, and SSL2b. Cell strings CS of each column may be connected with a corresponding bit line of the first and second bit lines BL1 and BL2.

Each of the cell strings CS may include at least one ground selection transistor GST connected with the ground selection line GSL and a plurality of memory cells MC1 to MC8 respectively connected with a plurality of word lines WL1 to WL8. A first row of cell strings CS may further include string selection transistors SSTa and SSTb respectively connected with the first string selection lines SSL1a and SSL1b. A second row of cell strings CS may further include string selection transistors SSTa and SSTb respectively connected with the second string selection lines SSL2a and SSL2b.

In each cell string CS, the ground selection transistor GST, the memory cells MC1 to MC8, and the string selection transistors SSTa and SSTb may be connected in series in a direction perpendicular to the substrate SUB and may be sequentially stacked in the direction perpendicular to the substrate SUB. In each cell string CS, at least one of the memory cells MC1 to MC8 may be used as a dummy memory cell. The dummy memory cell may not be programmed (e.g., may be program-inhibited) or may be programmed differently from the remaining memory cells of the memory cells MC1 to MC8.

In example embodiments, memory cells that are placed at the same height and are associated with the string selection lines SSL1a and SSL1b or SSL2a and SSL2b may form one physical page. Memory cells of one physical page may be connected to one sub-word line. Sub-word lines of physical pages placed at the same height may be connected in common with one word line.

Figure 3:
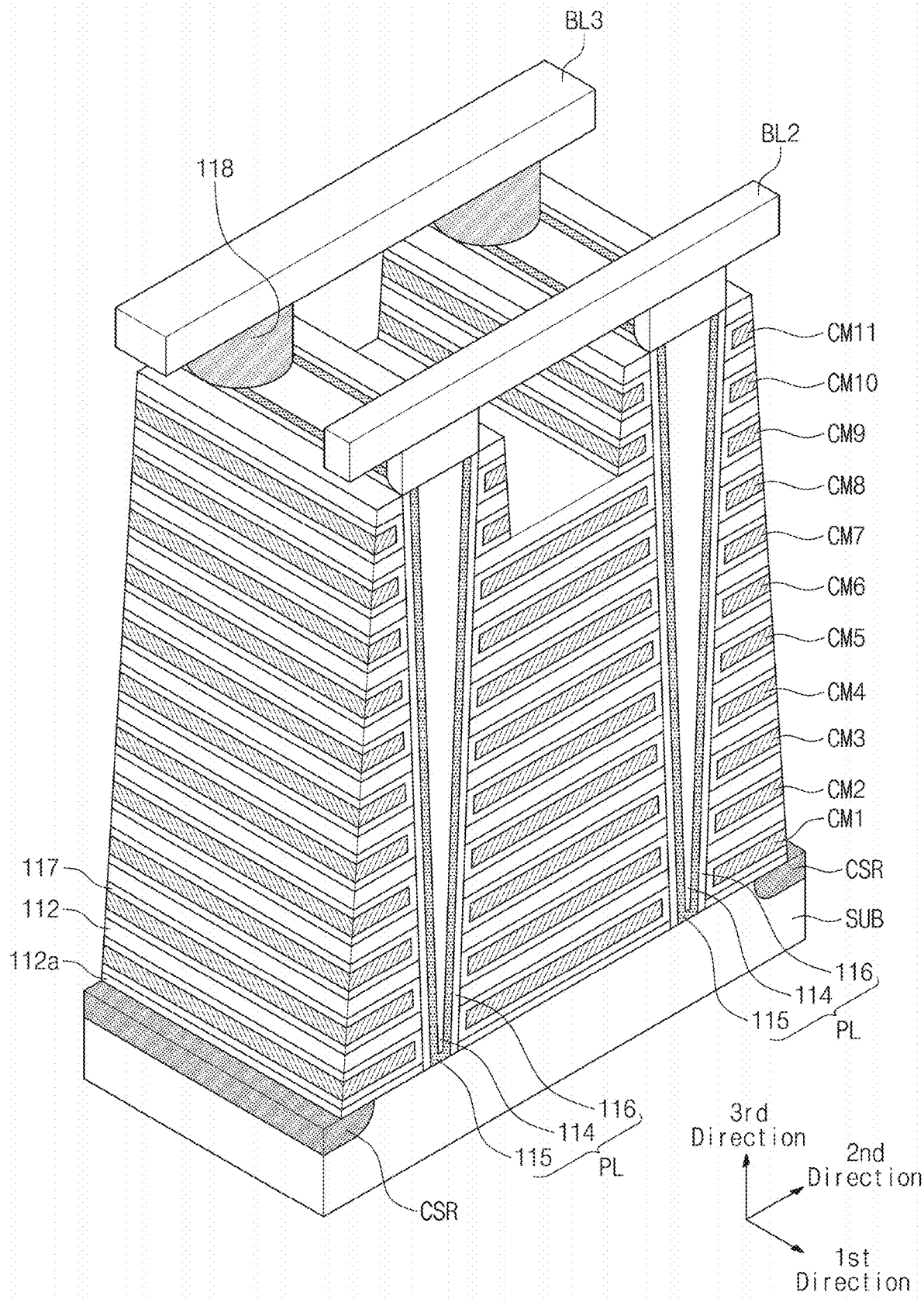
FIG. 3 is a perspective view of a structure of a part of a memory block of FIG. 2.

FIG. 3 is a perspective view of a structure of a part of the memory block BLKa of FIG. 2. Referring to FIGS. 2 and 3, common source regions CSR that extend in a first direction and are spaced from each other in a second direction are provided on the substrate SUB.

The common source regions CSR may be connected in common to form a common source line CSL. In example embodiments, the substrate SUB may include a P-type semiconductor material. The common source regions CSR may include an N-type semiconductor material. For example, a conductive material for increasing conductivity of the common source line CSL may be disposed on the common source region CSR.

Between the common source regions CSR, insulating layers 112 and 112*a* are sequentially stacked on the substrate SUB in a third direction perpendicular to the substrate SUB. The insulating layers 112 and 112*a* may be spaced from each other in the third direction. In example embodiments, the insulating layers 112 and 112*a* may include silicon oxide or silicon nitride. In example embodiments, a thicknesses (e.g., a thicknesses in the third direction) of the insulating layer 112*a*, which is in contact with the substrate SUB, from among the insulating layers 112 and 112*a* may be smaller than a thicknesses (e.g., a thicknesses in the third direction) of each of the remaining insulating layers 112.

Pillars PL that are disposed to be spaced from each other in the first direction and the second direction and penetrate the insulating layers 112 and 112*a* in the third direction are provided between the common source regions CSR. In example embodiments, the pillars PL may be in contact with the substrate SUB through the insulating layers 112 and 112*a*. Each of the pillars PL may include an inner material 114, a channel layer 115, and/or a first insulating layer 116.

The inner material 114 may include an insulating material or an air gap. The channel layer 115 may include a P-type semiconductor material or an intrinsic semiconductor material. The first insulating layer 116 may include one or more of insulating layers (e.g., different insulating layers) such as a silicon oxide layer, a silicon nitride layer, and an alumina oxide layer.

Between the common source regions CSR, second insulating layers 117 are provided on upper surfaces and lower surfaces of the insulating layers 112 and 112*a* and exposed outer surfaces of the pillars PL. There may be removed the second insulating layers 117 provided on an upper surface of an insulating layer placed at the highest height from among the insulating layers 112 and 112*a*.

In each of the pillars PL, the first insulating layer 116 and the second insulating layer 117, when coupled adjacent to each other, may form an information storage layer. For example, the first insulating layer 116 and the second insulating layer 117 may include oxide-nitride-oxide (ONO) or oxide-nitride-alumina (ONA). The first insulating layer 116 and the second insulating layer 117 may form a tunneling insulating layer, a charge trap layer, and a blocking insulating layer.

Between the common source regions CSR and between the insulating layers 112 and 112*a*, conductive materials CM1 to CM11 are provided on exposed outer surfaces of the second insulating layers 117. The conductive materials CM1 to CM11 may include a metallic conductive material. Drains 118 are provided on the pillars PL. In example embodiments, the drains 118 may include an N-type semiconductor material (e.g., silicon). In example embodiments, the drains 118 may be in contact with upper surfaces of the channel layers of the pillars PL.

The bit lines BL2 and BL3 that extend in the second direction and are spaced from each other in the first direction are provided on the drains 118. The bit lines BL2 and BL3 are connected with the drains 118. In example embodiments, the drains 118 and bit lines (e.g., BL2 and BL3) may be connected through contact plugs. The bit lines BL2 and BL3 may include a metallic conductive material.

The pillars PL form the cell strings CS together with the first and second insulating layers 116 and 117 and the conductive materials CM1 to CM11. Each of the pillars PL forms a cell string together with the first and second insulating layers 116 and 117 and the conductive materials CM1 to CM11 adjacent thereto. The first conductive material CM1 may form the ground selection transistors GST together with the first and second insulating layers 116 and 117 and the channel layers 115 adjacent thereto. The first conductive material CM1 may extend in the first direction to form the ground selection line GSL.

The second to ninth conductive materials CM2 to CM9 may form first to eighth memory cells MC1 to MC8 together with the first and second insulating layers 116 and 117 and the channel layers 115 adjacent thereto. The second to ninth conductive materials CM2 to CM9 may extend in the first direction to form first to eighth word lines WL1 to WL8, respectively.

The tenth conductive materials CM10 may form the string selection transistors SSTa together with the first and second insulating layers 116 and 117 adjacent to each other and the channel layers 115. The tenth conductive materials CM10 may extend in the first direction to form the string selection lines SSL1a and SSL2a.

The eleventh conductive materials CM11 may form the string selection transistors SSTb together with the first and second insulating layers 116 and 117 adjacent to each other and the channel layers 115. The eleventh conductive materials CM11 may extend in the first direction to form the string selection lines SSL1b and SSL2b.

As the first to eleventh conductive materials CM1 to CM11 are stacked in the third direction, in each cell string CS, the ground selection transistor GST, the memory cells MC1 to MC8, and the string selection transistors SSTa and SSTb may be stacked in the third direction.

As the channel layer 115 is shared by the first to eleventh conductive materials CM1 to CM11 in each of the pillars PL, in each cell string CS, the ground selection transistor GST, the memory cells MC1 to MC8, and the string selection transistors SSTa and SSTb may be serially connected in the third direction. For example, the channel layer 115 thus shared may form a vertical body.

As the first to ninth conductive materials CM1 to CM9 are connected in common, the ground selection line GSL and the first to eighth word lines WL1 to WL8 may be viewed as being connected in common in the cell strings CS.

The memory block BLKa may be provided at a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In example embodiments of the present disclosure, the 3D memory array includes vertical cell strings CS (or NAND strings) that are vertically oriented such that at least one memory cell is located over another memory cell. The at least one memory cell may comprise a charge trap layer. Each cell string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As illustrated in FIG. 3, the channel layer 115 and the conductive materials CM1 to CM11 are separated by the first insulating layer 116 and the second insulating layer 117. In example embodiments where the first insulating layer 116 and the second insulating layer 117 degrade, the channel layer 115 and the conductive materials CM1 to CM11 may be short-circuited. For example, the first insulating layer 116 and the second insulating layer 117 may be degraded due to iterative write and erase operations.

In example embodiments where the channel layer 115 and one of the conductive materials CM1 to CM11 are short-circuited, a voltage of the channel layer 115 may follow a voltage of the short-circuited one of the conductive materials CM1 to CM11. This short circuit may cause an abnormal operation of the nonvolatile memory device 100 that performs the write operation, the read operation, and the erase operation based on a voltage of the channel layer 115.

Figure 4:
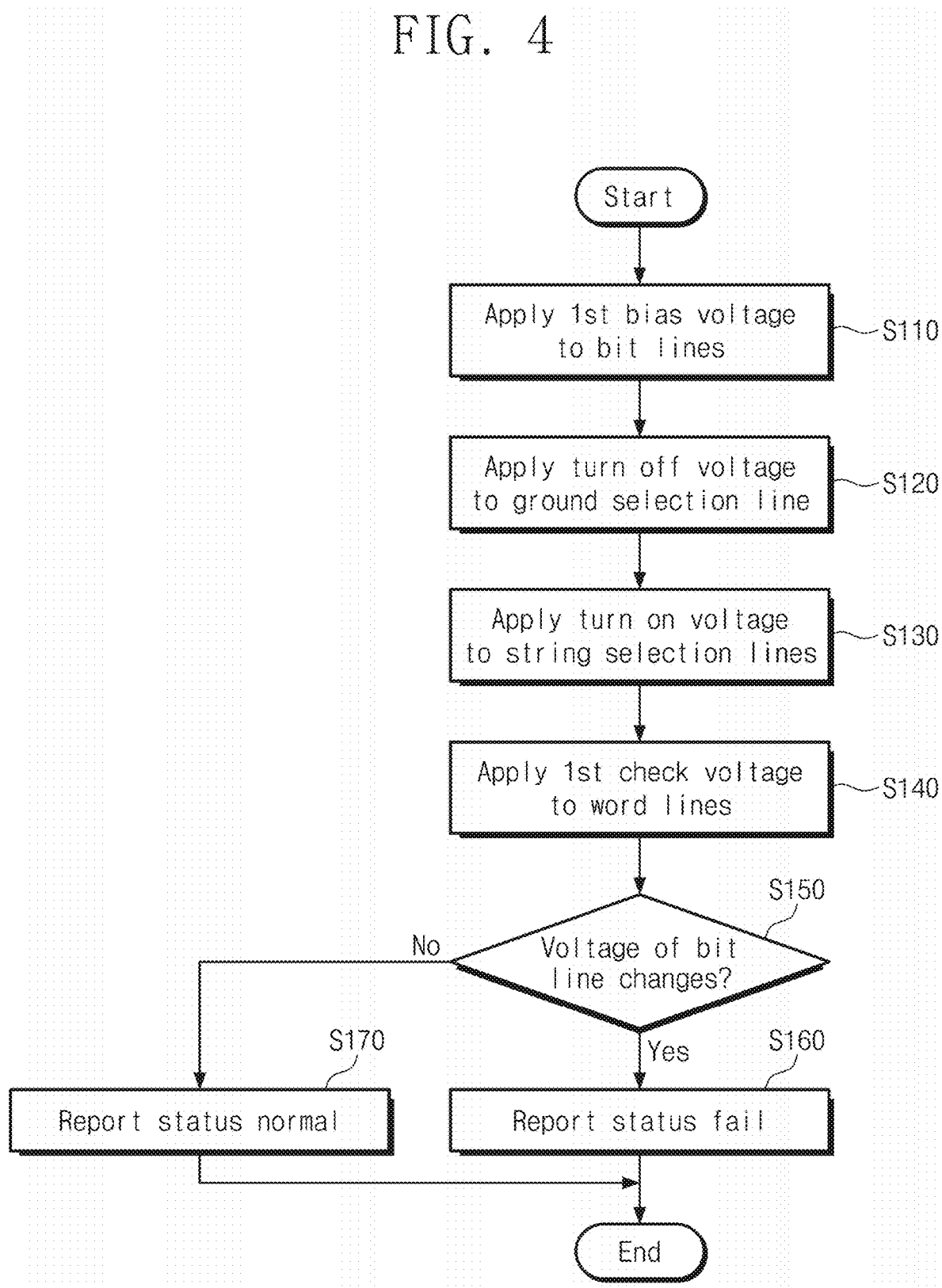
FIG. 4 illustrates an example in which a nonvolatile memory device performs a check operation.

FIG. 4 illustrates an example in which the nonvolatile memory device 100 performs a check operation. The nonvolatile memory device 100 may check a channel failure occurring when a channel is short-circuited, by performing the check operation.

Referring to FIGS. 1, 2, and 4, in operation S110, the page buffer 130 may apply a first bias voltage VBA (refer to FIG. 5) to the bit lines BL. In operation S120, the row decoder 120 may apply a turn-off voltage VOFF (refer to FIG. 5) to the ground selection line GSL. In operation S130, the row decoder 120 may apply a turn-on voltage VON (refer to FIG. 5) to the string selection lines SSL1a, SSL1b, SSL2a, and SSL2b. In operation S140, the row decoder 120 may apply a check voltage VCK (refer to FIG. 5) to the word lines WL1 to WL8. Operation S110 to operation S140 may constitute a first time period of the check operation.

In operation S150, the page buffer 130 may detect (or sense) changes in voltages of the bit lines BL. In example embodiments, the page buffer 130 may float the bit lines BL during the first time period and may then detect the voltages of the bit lines BL. The page buffer 130 may detect whether the voltages of the bit lines BL change from the first bias voltage VBA. Operation S150 in which changes in voltages of the bit lines BL are detected may constitute a second time period of the check operation.

In response to that the changes in the voltages of the bit lines BL are detected, in operation S160, the nonvolatile memory device 100 may report a status fail. For example, the nonvolatile memory device 100 may output a status fail signal in the form of data "DATA" or a control signal CTRL.

In response to that the voltages of the bit lines BL do not change, in operation S170, the nonvolatile memory device 100 may report a status normal. For example, the nonvolatile memory device 100 may report the status normal by outputting no status fail signal. The nonvolatile memory device 100 may terminate the check operation.

Figure 5:
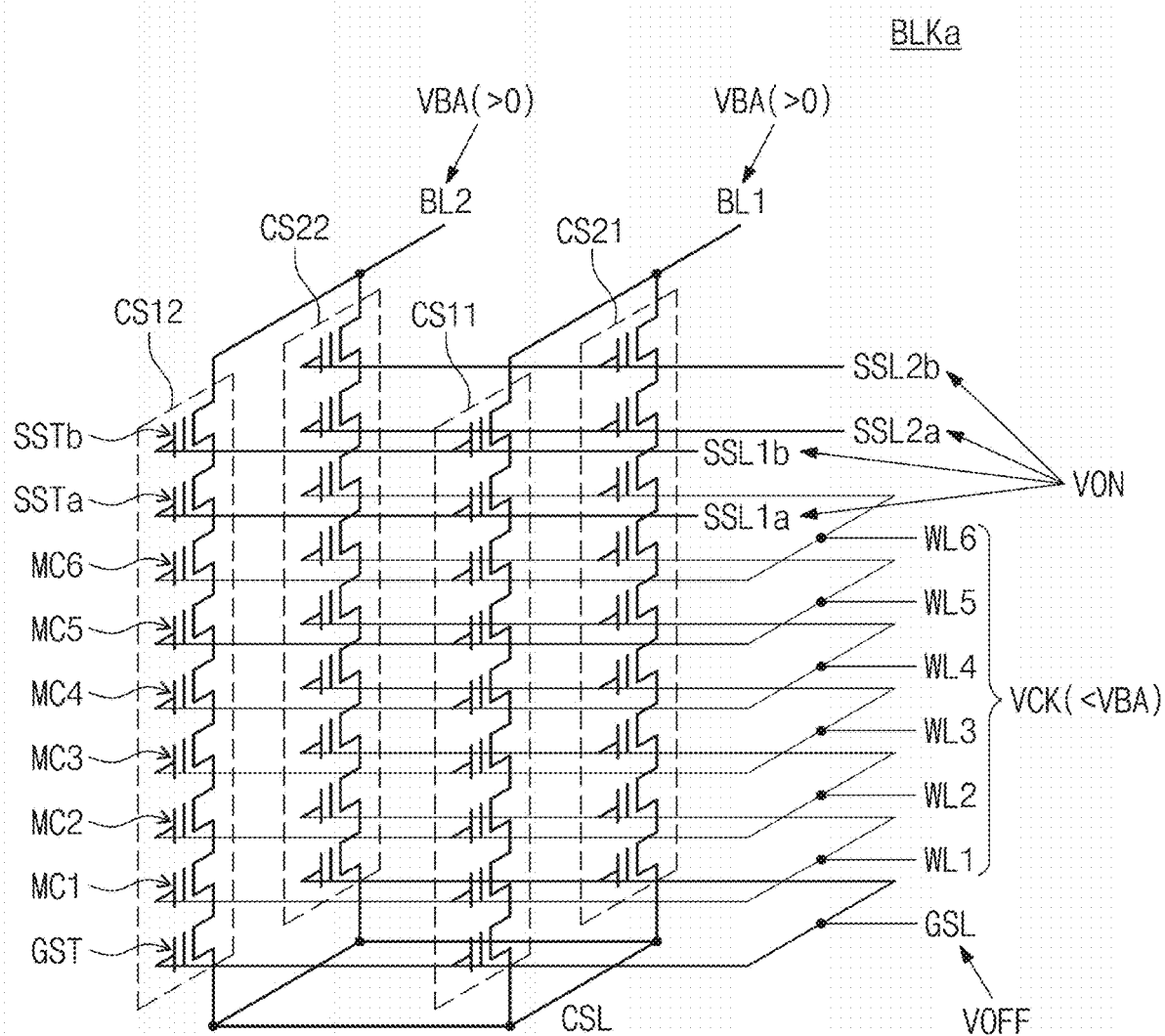
FIG. 5 illustrates a first example of voltages applied to a memory block in a check operation.

FIG. 5 illustrates a first example of voltages applied to the memory block BLKa in the check operation. Referring to FIGS. 1, 4, and 5, the bias voltage VBA applied to the bit lines BL1 and BL2 may be a positive voltage. The turn-off voltage VOFF applied to the ground selection line GSL may be a voltage sufficient to turn off the ground selection transistors GST. The turn-on voltage VON applied to the string selection lines SSL1a, SSL1b, SSL2a, and SSL2b may be a voltage sufficient to turn on the string selection transistors SSTa and SSTb. The check voltage VCK applied to the word lines WL1 to WL8 may be a voltage sufficient to turn on the memory cells MC1 to MC8 and may be smaller than the bias voltage VBA.

In example embodiments where a channel failure that a channel is short-circuited exists, voltages of the bit lines BL1 and BL2 may decrease from the bias voltage VBA to the check voltage VCK. The page buffer 130 may determine that a short-circuited channel, that is, a channel failure exists, based on that the voltages of the bit lines BL1 and BL2 decrease from the bias voltage VBA to the check voltage VCK.

In example embodiments, the check operation may be performed when the memory cells MC1 to MC8 of the memory block BLKa are in an erase state. Threshold voltages of the memory cells MC1 to MC8 being in the erase state may be smaller than the ground voltage. The row decoder 120 may apply the ground voltage as the check voltage VCK. The page buffer 130 may detect whether voltages of the bit lines BL decrease to the ground voltage. The control logic 170 may determine that a short-circuited channel, that is, a channel failure exists, based on that the voltages of the bit lines BL1 and BL2 decreases to the ground voltage.

In example embodiments, the turn-on voltage VON may be 5 V or more. The bias voltage VBA may be 1 V or more. The turn-off voltage VOFF may be the ground voltage. The check voltage VCK may be a positive voltage (e.g., 0.5 V or less) or a negative voltage (e.g., −0.5 V or more) close to the ground voltage.

Figure 6:
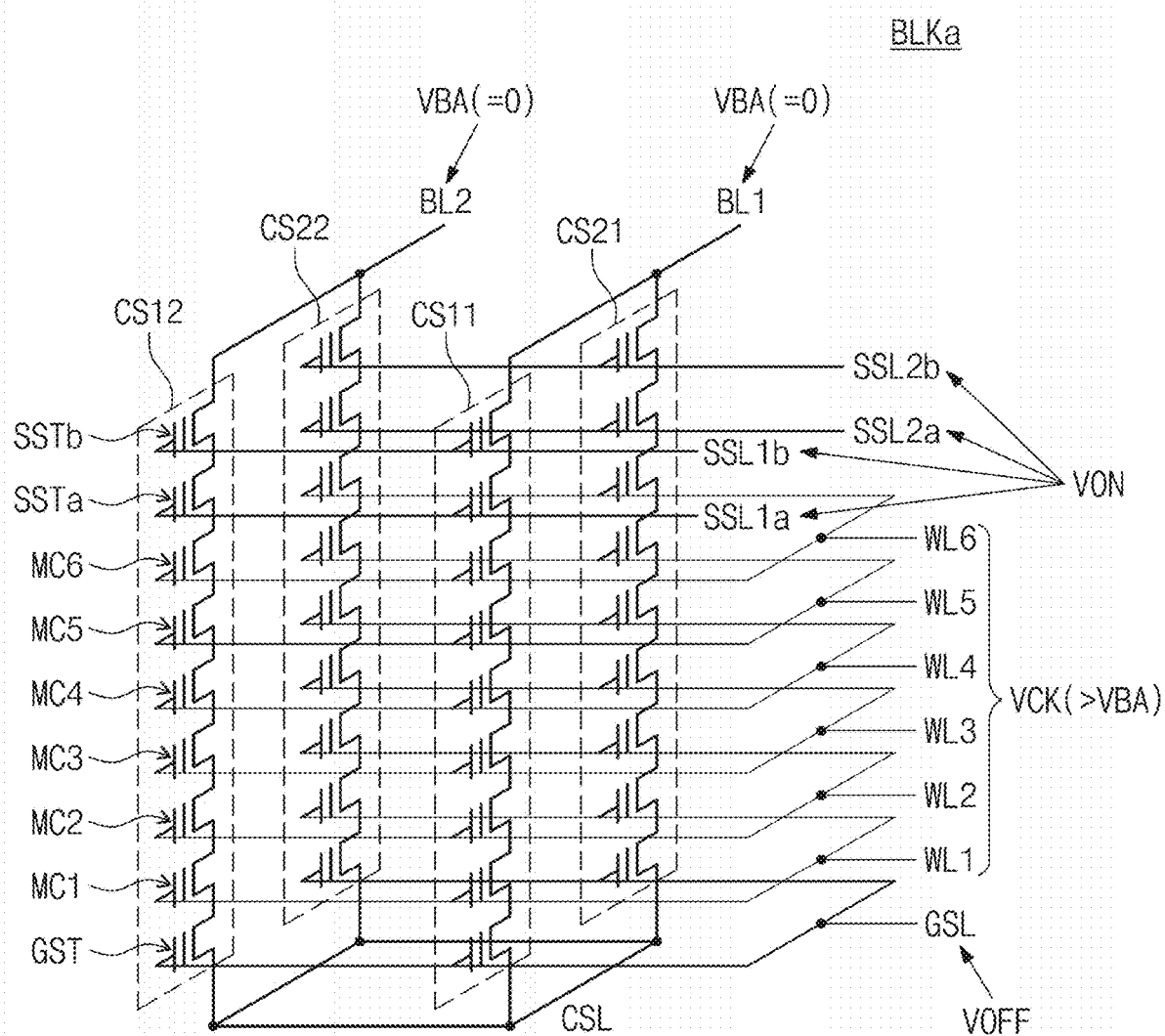
FIG. 6 illustrates a second example of voltages applied to a memory block in a check operation.

FIG. 6 illustrates a second example of voltages applied to the memory block BLKa in the check operation. Referring to FIGS. 1, 4, and 6, the bias voltage VBA applied to the bit lines BL1 and BL2 may be the ground voltage (e.g., 0 V). The turn-off voltage VOFF applied to the ground selection line GSL may be a voltage sufficient to turn off the ground selection transistors GST. The turn-on voltage VON applied to the string selection lines SSL1a, SSL1b, SSL2a, and SSL2b may be a voltage sufficient to turn on the string selection transistors SSTa and SSTb. The check voltage VCK applied to the word lines WL1 to WL8 may be a voltage sufficient to turn on the memory cells MC1 to MC8 and may be greater than the bias voltage VBA.

In example embodiments where a channel failure that a channel is short-circuited exists, voltages of the bit lines BL1 and BL2 may increase from the bias voltage VBA to the check voltage VCK. The page buffer 130 may determine that a short-circuited channel, that is, a channel failure exists, based on that the voltages of the bit lines BL1 and BL2 increase from the bias voltage VBA to the check voltage VCK.

In example embodiments, the check operation may be performed when the memory cells MC1 to MC8 of the memory block BLKa are in an erase state. Threshold voltages of the memory cells MC1 to MC8 being in the erase state may be smaller than the ground voltage. The row decoder 120 may apply a positive voltage of 1 V or more as the check voltage VCK. The page buffer 130 may detect whether voltages of the bit lines BL increase to the check voltage VCK. The control logic 170 may determine that a short-circuited channel, that is, a channel failure exists, based on that the voltages of the bit lines BL1 and BL2 increase to the check voltage VCK.

In example embodiments, the turn-on voltage VON may be 5 V or more. The turn-off voltage VOFF may be the ground voltage. The bias voltage VBA may be a positive voltage (e.g., 0.5 V or less) or a negative voltage (e.g., −0.5 V or more) close to the ground voltage.

A voltage change of the channel layer 115 (refer to FIG. 3) may occur due to abnormal operations of the ground selection transistors GST as well as the short-circuited channel. For example, in example embodiments where a threshold voltage of a specific ground selection transistor GST is smaller than the turn-off voltage VOFF, a voltage of the channel layer 115 corresponding to the specific ground selection transistor GST may change to a voltage of the common source line CSL.

Figure 7:
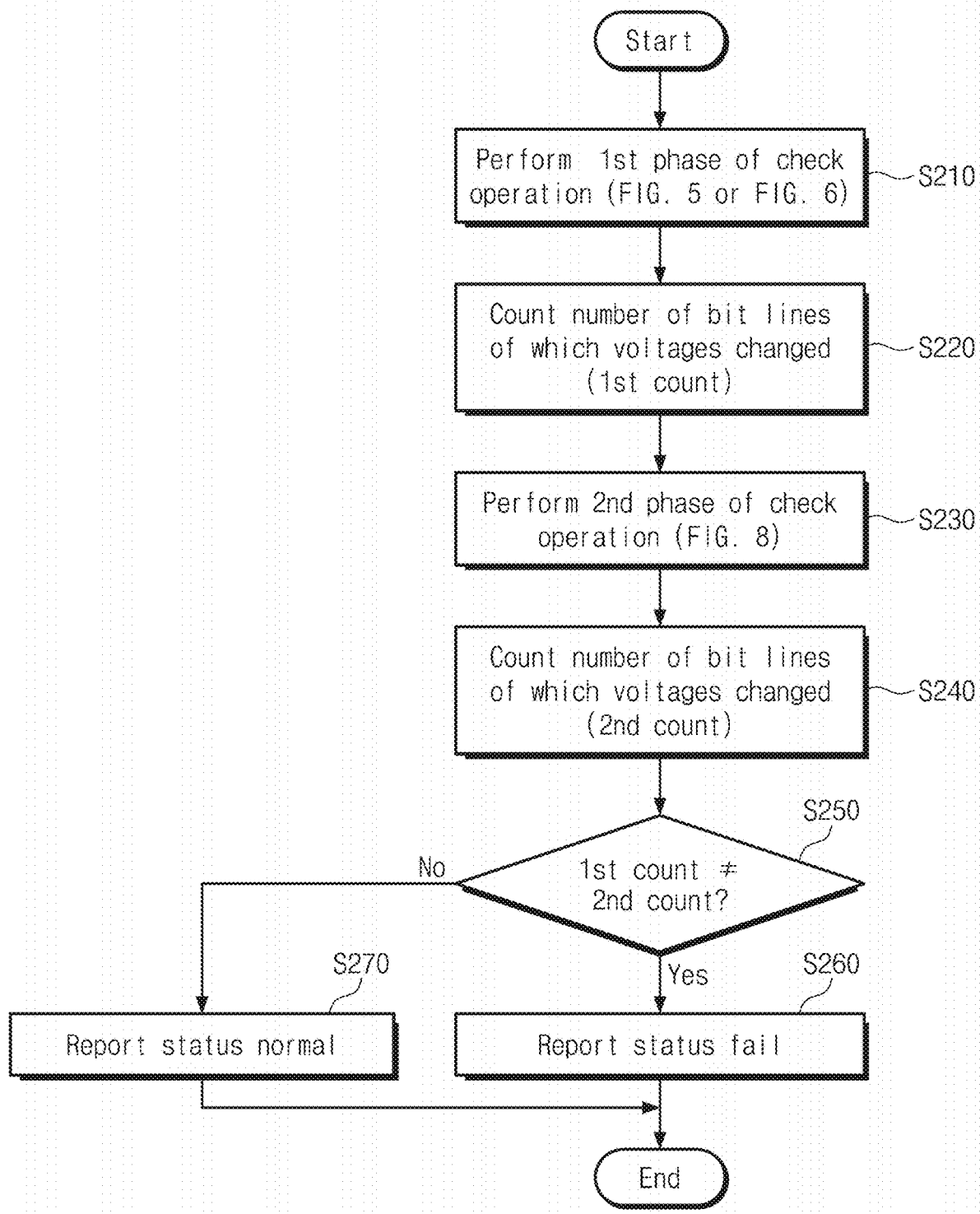
FIG. 7 illustrates an example in which a nonvolatile memory device performs a check operation by distinguishing a threshold voltage error of ground selection transistors and a short-circuited channel error.

Because memory cells at the same height are controlled in common with a word line, a short-circuited channel may cause a large-scale error of a word line unit. In contrast, a threshold voltage error of the ground selection transistor GST may cause an error limited to one cell string CS11, CS12, CS21, or CS22 and may be correctable by an error correction code. Accordingly, the nonvolatile memory device 100 according to example embodiments of the present disclosure may distinguish a short-circuited channel error and a threshold voltage error of the ground selection transistor GST and may omit a status fail report associated with the threshold voltage error of the ground selection transistor GST FIG. 7 illustrates an example in which the nonvolatile memory device 100 performs the check operation by distinguishing a threshold voltage error of the ground selection transistors GST and a short-circuited channel error. Referring to FIGS. 1, 2, and 7, in operation S210, the nonvolatile memory device 100 may perform a first phase of the check operation. For example, the first phase of the check operation may include the following operation of FIG. 4: applying the voltages described with reference to FIGS. 5 and 6 to detect voltage changes of bit lines and determining a status fail or a status normal in response to a result of the detection.

In operation S220, the pass/fail check block 140 of the nonvolatile memory device 100 may count the number of bit lines, the voltages of which change, as a first count. The pass/fail check block 140 may provide the first count to the control logic 170.

In operation S230, the nonvolatile memory device 100 may perform a second phase of the check operation. The second phase will be described with reference to FIG. 8. In operation S240, the pass/fail check block 140 of the nonvolatile memory device 100 may count the number of bit lines, the voltages of which change, as a second count. The pass/fail check block 140 may provide the second count to the control logic 170.

In operation S250, the control logic 170 may determine whether the first count and the second count are not equal. In response to that the first count and the second count are not equal, in operation S260, the control logic 170 may determine the status fail. For example, the control logic 170 may output a status fail signal as the data "DATA" or the control signal CTRL.

In response to that the first count and the second count are equal, in operation S270, the control logic 170 may determine the status normal. The control logic 170 may report the status normal by omitting an output of the status fail signal.

In example embodiments, the first count may indicate a union of a short-circuited channel error and a threshold voltage error of the ground selection transistors GST. The second count may indicate a threshold voltage error of the ground selection transistors GST. In example embodiments where the first count and the second count are equal, the voltage changes of the bit lines BL1 and BL2 detected in the first phase of the check operation may come from the threshold voltage error of the ground selection transistors GST. Accordingly, the control logic 170 may determine the status normal.

Figure 8:
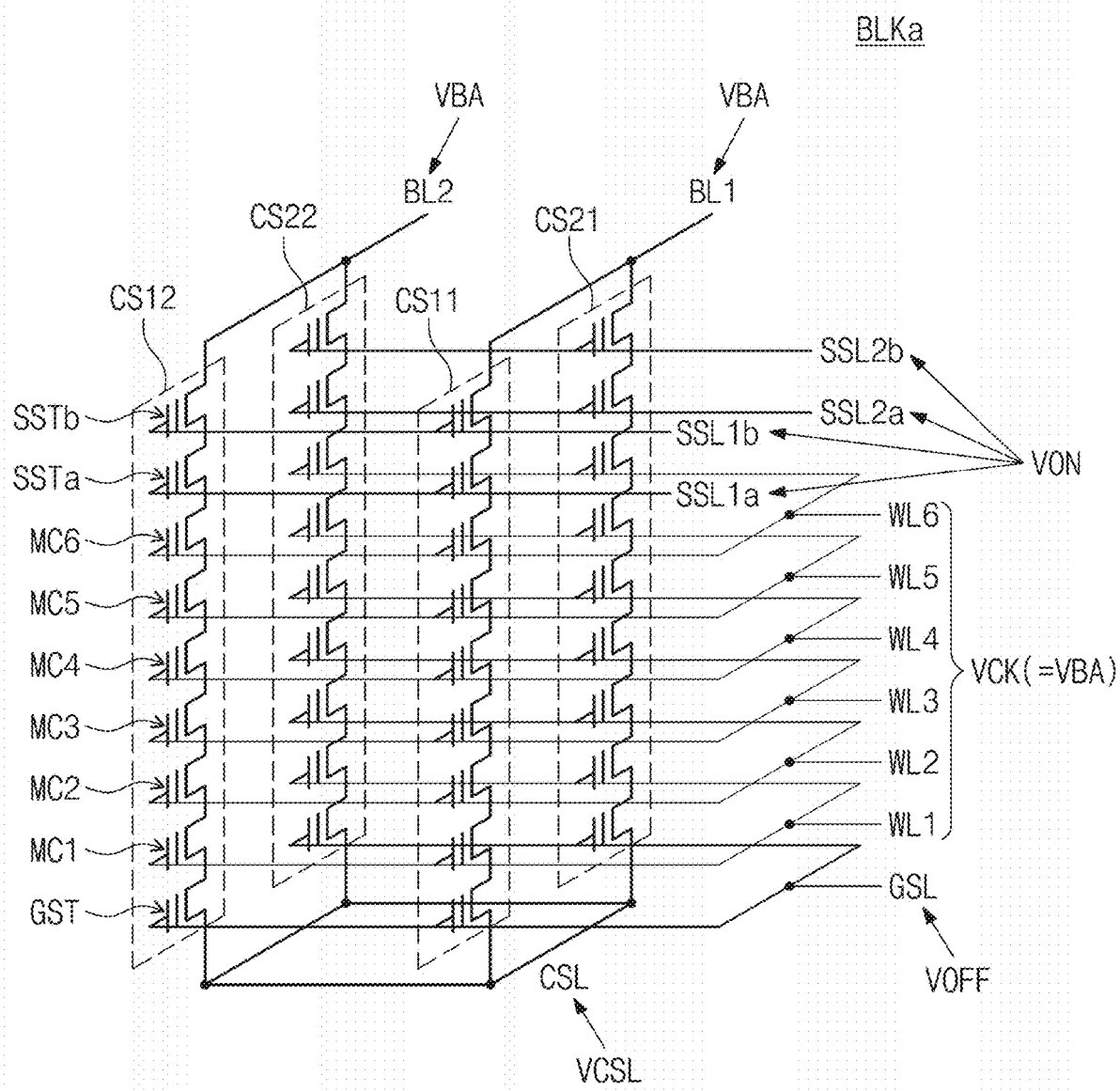
FIG. 8 illustrates an example of voltages applied to a memory block in a second phase of a check operation.

FIG. 8 illustrates an example of voltages applied to the memory block BLKa in the second phase of the check operation. In example embodiments, bias voltages of the memory block BLKa described with reference to FIG. 4 may be identically applied to the memory block BLKa of FIG. 8. In addition to the description given with reference to FIG. 4, in the second phase of the check operation, a common source line voltage VCSL may be applied to the common source line CSL.

The second phase of the check operation may include a third time period and a fourth time period. In the third time period, the page buffer 130 may apply the bias voltage VBA to the bit lines BL1 and BL2. The row decoder 120 may apply the check voltage VCK to the word lines WL1 to WL8. The check voltage VCK may be a voltage sufficient to turn on the memory cells MC1 to MC8, and a level of the check voltage VCK may be identical or similar to that of the bias voltage VBA.

The row decoder 120 may apply the turn-on voltage VON to the string selection lines SSL1a, SSL1b, SSL2a, and SSL2b. The row decoder 120 may apply the turn-off voltage VOFF to the ground selection line GSL. The common source line voltage VCSL may be applied to the common source line CSL. The common source line voltage VCSL may be different from the bias voltage VBA.

In the fourth time period, the page buffer 130 may detect changes of voltages of the bit lines BL1 and BL2. For example, a voltage of a bit line connected with a cell string where a short-circuited channel error occurs may correspond to the check voltage VCK. Because the check voltage VCK is identical to the bias voltage VBA, a voltage of a bit line associated with a short-circuited channel error may be maintained without a change.

A voltage of a bit line connected with a cell string where a threshold voltage error of the ground selection transistor GST occurs may correspond to the common source line voltage VCSL. Because the common source line voltage VCSL is different from the bias voltage VBA, a voltage of a bit line connected with the threshold voltage error of the ground selection transistor GST may change to the common source line voltage VCSL.

As described above, the nonvolatile memory device 100 according to example embodiments of the present disclosure may distinguish a short-circuited channel error and a threshold voltage error of the ground selection transistor GST. Accordingly, a bad block may be reduced or prevented from occurring due to the threshold voltage error of the ground selection transistor GST. This may mean that a decrease in capacity of the nonvolatile memory device 100 may be reduced or minimized.

An example where a status fail or a status normal is determined based on a result of comparing the first count of the first phase of the check operation and the second count of the second phase of the check operation is described with reference to FIG. 7. However, the status fail or the status normal may be determined by adjusting voltage levels without comparing counts.

Table 1 below shows an example of voltages applied in the first phase and the second phase of the check operation.

TABLE 1

| | VBA | VCK | VCSL | Normal voltage | Error voltage |
|---|---|---|---|---|---|
| First phase | VDD | VSS | | VDD | VSS |
| Second phase | Normal BL: VDD Error BL: VSS | VSS | VDD | VSS | VDD |

Referring to FIG. 5 and Table 1 above, in the first phase of the check operation, the page buffer 130 may apply a power supply voltage VDD as the bias voltage VBA. The row decoder 120 may apply the ground voltage VSS as the check voltage VCK. A voltage (e.g., a normal voltage) of a bit line that is connected with a cell string where a short-circuited channel error or a threshold voltage error of the ground selection transistor GST does not exist may be the power supply voltage VDD. A voltage (e.g., an error voltage) of a bit line that is connected with a cell string where a short-circuited channel error or a threshold voltage error of the ground selection transistor GST exists may be the ground voltage VSS. The page buffer 130 may latch voltages of the bit lines BL1 and BL2.

In the second phase, the page buffer 130 may apply the bias voltage VBA based on a detection result of the first phase. For example, a voltage change may be detected with respect to an error bit line BL where an error voltage is detected in the first phase. The page buffer 130 may apply the power supply voltage VDD to a normal bit line BL where a normal voltage is detected in the first phase. The page buffer 130 may apply the ground voltage VSS to an error bit line BL where an error voltage is detected in the first phase. The row decoder 120 may apply the ground voltage VSS as the check voltage VCK. The power supply voltage VDD may be applied as the common source line voltage VCSL.

In the first phase, a voltage of a bit line (e.g., an error-free bit line) that is connected with a cell string where a short-circuited channel error and a threshold voltage error of the ground selection transistor GST do not exist may be detected as the power supply voltage VDD. In the second phase, the bias voltage VBA of the power supply voltage VDD may be applied to the error-free bit line. In the second phase, because a voltage of the error-free bit line is maintained without a change, the power supply voltage VDD may be detected.

In the first phase, a voltage of a bit line (e.g., a first type of error bit line) that is connected with a cell string where a threshold voltage error of the ground selection transistor GST exists may be detected as the ground voltage VSS. In the second phase, the bias voltage VBA of the ground voltage VSS may be applied to the first type of error bit line. In the second phase, because a voltage of the first type of error bit line changes to the power supply voltage VDD, the power supply voltage VDD may be detected.

In the first phase, a voltage of a bit line (e.g., a second type of error bit line) that is connected with a cell string where a short-circuited error exists may be detected as the ground voltage VSS. In the second phase, the bias voltage VBA of the ground voltage VSS may be applied to the second type of error bit line. In the second phase, because a voltage of the second type of error bit line does not change, the ground voltage VSS may be detected.

As described with reference to FIG. 5 and Table 1 above, in the first phase of the check operation, voltages of bit lines connected with cell strings where a short-circuited channel error and a threshold voltage error of the ground selection transistor GST exist may be set to the ground voltage VSS. In the second phase of the check operation, voltages of bit lines connected with cell strings where a threshold voltage error of the ground selection transistor GST exists may be set to the power supply voltage VDD.

Accordingly, as the first phase and the second phase of the check operation are performed, voltages of bit lines connected with cell strings where only a short-circuited channel error exists may be set to the ground voltage VSS, and voltages of the remaining bit lines may be set to the power supply voltage VDD. That is, without counting in the first phase and counting in the second phase, when a bit line corresponding to the ground voltage VSS exists after the first phase and the second phase are performed, a status fail may be determined.

TABLE 2

| | VBA | VCK | VCSL | Normal voltage | Error voltage |
|---|---|---|---|---|---|
| First phase | VSS | VDD | | VSS | VDD |
| Second phase | Normal BL: VSS Error BL: VDD | VDD | VSS | VSS | VDD |

Referring to FIG. 6 and Table 2 above, in the first phase of the check operation, the page buffer 130 may apply the ground voltage VSS as the bias voltage VBA. The row decoder 120 may apply the power supply voltage VDD as the check voltage VCK. A voltage (e.g., a normal voltage) of a bit line that is connected with a cell string where a short-circuited channel error or a threshold voltage error of the ground selection transistor GST does not exist may be the ground voltage VSS. A voltage (e.g., an error voltage) of a bit line that is connected with a cell string where a short-circuited channel error or a threshold voltage error of the ground selection transistor GST exists may be the power supply voltage VDD. The page buffer 130 may latch voltages of the bit lines BL1 and BL2.

In the second phase, the page buffer 130 may apply the bias voltage VBA based on a detection result of the first phase. For example, a voltage change may be detected with respect to an error bit line BL where an error voltage is detected in the first phase. The page buffer 130 may apply the ground voltage VSS to a normal bit line BL where a normal voltage is detected in the first phase. The page buffer 130 may apply the power supply voltage VDD to an error bit line BL where an error voltage is detected in the first phase. The row decoder 120 may apply the power supply voltage VDD as the check voltage VCK. The ground voltage VSS may be applied as the common source line voltage VCSL.

In the first phase, a voltage of a bit line (e.g., an error-free bit line) that is connected with a cell string where a short-circuited channel error and a threshold voltage error of the ground selection transistor GST do not exist may be detected as the ground voltage VSS. In the second phase, the bias voltage VBA of the ground voltage VSS may be applied to the error-free bit line. In the second phase, because a voltage of the error-free bit line is maintained without a change, the ground voltage VSS may be detected.

In the first phase, a voltage of a bit line (e.g., a first type of error bit line) that is connected with a cell string where a threshold voltage error of the ground selection transistor GST exists may be detected as the power supply voltage VDD. In the second phase, the bias voltage VBA of the power supply voltage VDD may be applied to the first type of error bit line. In the second phase, because a voltage of the first type of error bit line changes to the ground voltage VSS, the ground voltage VSS may be detected.

In the first phase, a voltage of a bit line (e.g., a second type of error bit line) that is connected with a cell string where a short-circuited error exists may be detected as the power supply voltage VDD. In the second phase, the bias voltage VBA of the power supply voltage VDD may be applied to the second type of error bit line. In the second phase, because a voltage of the second type of error bit line does not change, the power supply voltage VDD may be detected.

As described with reference to FIG. 6 and Table 2 above, in the first phase of the check operation, voltages of bit lines connected with cell strings where a short-circuited channel error and a threshold voltage error of the ground selection transistor GST exist may be set to the power supply voltage VDD. In the second phase of the check operation, voltages of bit lines connected with cell strings where a threshold voltage error of the ground selection transistor GST exists may be set to the ground voltage VSS.

Accordingly, as the first phase and the second phase of the check operation are performed, voltages of bit lines connected with cell strings where only a short-circuited channel error exists may be set to the power supply voltage VDD, and voltages of the remaining bit lines may be set to the ground voltage VSS. That is, without counting in the first phase and counting in the second phase, when a bit line corresponding to the power supply voltage VDD exists after the first phase and the second phase are performed, a status fail may be determined.

In the above example embodiments, the description is given as the nonvolatile memory device 100 checks whether a short-circuited channel error is present in a memory block. In addition, the nonvolatile memory device 100 may be further configured to specify a word line where a short-circuited channel error occurs.

For example, in the example embodiments described with reference to FIG. 5, the check voltage VCK smaller than the bias voltage VBA may be applied to a word line selected for checking a short-circuited channel from among the word lines WL1 to WL8. The bias voltage VBA may be applied to a word line not selected in checking a short-circuited channel. Example embodiments where voltages of the bit lines BL1 and BL2 change may be regarded as a short-circuited channel error occurs at a relevant word line or a threshold voltage error of the ground selection transistor GST occurs at a relevant cell string. Afterwards, whether a voltage change of a bit line corresponds to a short-circuited channel error may be determined through the second phase of FIG. 8.

In the example embodiments described with reference to FIG. 6, the check voltage VCK greater than the bias voltage VBA may be applied to a word line selected for checking a short-circuited channel from among the word lines WL1 to WL8. The bias voltage VBA may be applied to a word line not selected in checking a short-circuited channel. Example embodiments where voltages of the bit lines BL1 and BL2 change may be regarded as a short-circuited channel error occurs at a relevant word line or a threshold voltage error of the ground selection transistor GST occurs at a relevant cell string. Afterwards, whether a voltage change of a bit line corresponds to a short-circuited channel error may be determined through the second phase of FIG. 8.

The control logic 170 may specify a word line(s) associated with a short-circuited channel error while sequentially selecting the word lines WL1 to WL8. The control logic 170 may output information about a location of a word line together with a status fail signal or may output the information about the location of the word line in response to a status read command received from the outside.

In Table 1 and Table 2 above, the first phase and the second phase of the check operation are described by using the terms "power supply voltage VDD" and "ground voltage VSS". However, levels of voltages that are applied to the memory block BLKa are not limited by the terms "power supply voltage VDD" and "ground voltage VSS". The power supply voltage VDD may be interchangeable with a first voltage that is identified as a first logical level, the ground voltage VSS may be interchangeable with a second voltage that is smaller than the first voltage and is identified as a second logical level.

Figure 9:
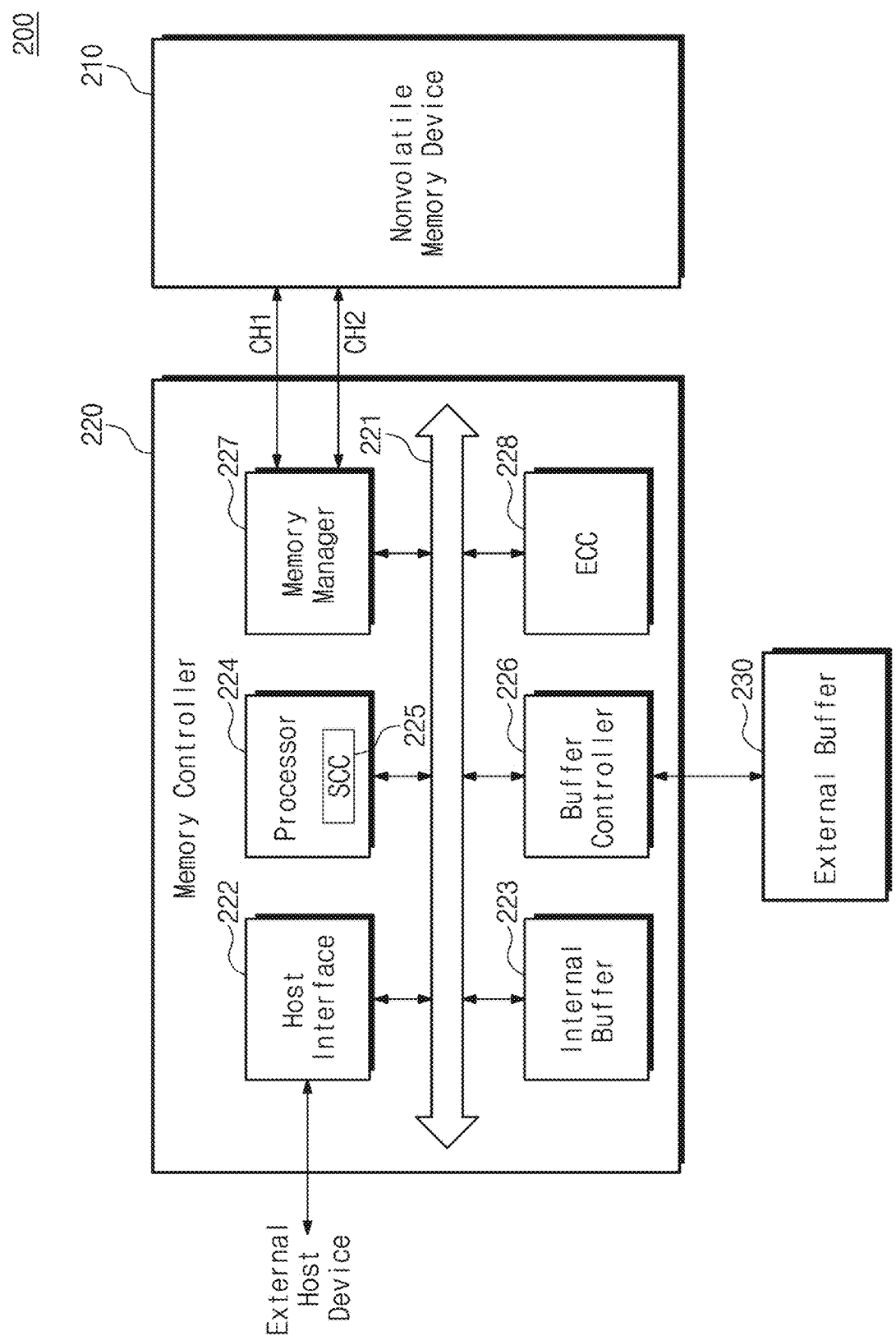
FIG. 9 illustrates a storage device according to example embodiments of the present disclosure.

FIG. 9 illustrates a storage device 200 according to example embodiments of the present disclosure. Referring to FIG. 9, the storage device 200 may include a nonvolatile memory device 210, a memory controller 220, and/or an external buffer 230. The nonvolatile memory device 210 may include a plurality of memory cells. Each of the plurality of memory cells may store two or more bits.

For example, the nonvolatile memory device 210 may include at least one of various nonvolatile memory devices such as a flash memory device, a phase change memory device, a ferroelectric memory device, a magnetic memory device, and a resistive memory device. The nonvolatile memory device 210 may include the nonvolatile memory device 100 described with reference to FIGS. 1 to 8. The nonvolatile memory device 210 may perform the check operation in response to a designated command.

The memory controller 220 may receive various requests for writing data in the nonvolatile memory device 210 or reading data from the nonvolatile memory device 210 from an external host device. The memory controller 220 may store (or buffer) user data, that are exchanged with the external host device, in the external buffer 230 and may store meta data for managing the storage device 200 in the external buffer 230.

The memory controller 220 may access the nonvolatile memory device 210 through a first channel CH1 and a second channel CH2. For example, the memory controller 220 may transmit a command and an address to the nonvolatile memory device 210 through the first channel CH1. The memory controller 220 may exchange data with the nonvolatile memory device 210 through the first channel CH1.

The memory controller 220 may transmit a first control signal to the nonvolatile memory device 210 through the second channel CH2. The memory controller 220 may receive a second control signal from the nonvolatile memory device 210 through the second channel CH2.

In example embodiments, the memory controller 220 may be configured to control two or more nonvolatile memory devices. The memory controller 220 may provide first different channels and second different channels for each of two or more nonvolatile memory devices.

For another example, the memory controller 220 may share one first channel with respect to two or more nonvolatile memory devices. The memory controller 220 may share a portion of the second channel CH2 with regard to two or more nonvolatile memory devices and may separately provide the remaining portion thereof.

The external buffer 230 may include a random access memory. For example, external buffer 230 may include at least one of a dynamic random access memory, a phase change random access memory, a ferroelectric random access memory, a magnetic random access memory, or a resistive random access memory.

The memory controller 220 may include a bus 221, a host interface 222, an internal buffer 223, a processor 224, a buffer controller 226, a memory manager 227, and/or an error correction code (ECC) block 228.

The bus 221 may provide communication channels between components in the memory controller 220. The host interface 222 may receive various requests from the external host device and may parse the received requests. The host interface 222 may store the parsed requests to the internal buffer 223.

The host interface 222 may transmit various responses to the external host device. The host interface 222 may exchange signals with the external host device in compliance with a given communication protocol. The internal buffer 223 may include a random access memory. For example, the internal buffer 223 may include a static random access memory or a dynamic random access memory.

The processor 224 may drive an operating system or firmware for driving the memory controller 220. The processor 224 may read the parsed requests stored in the internal buffer 223 and may generate commands and addresses for controlling the nonvolatile memory device 210. The processor 224 may transfer the generated commands and addresses to the memory manager 227.

The processor 224 may store various meta data for managing the storage device 200 to the internal buffer 223. The processor 224 may access the external buffer 230 through the buffer controller 226. The processor 224 may control the buffer controller 226 and the memory manager 227 such that the user data stored in the external buffer 230 are transmitted to the nonvolatile memory device 210.

The processor 224 may control the host interface 222 and the buffer controller 226 such that the data stored in the external buffer 230 are transmitted to the external host device. The processor 224 may control the buffer controller 226 and the memory manager 227 such that data received from the nonvolatile memory device 210 are stored to the external buffer 230. The processor 224 may control the host interface 222 and the buffer controller 226 such that data received from the external host device are stored to the external buffer 230.

Under control of the processor 224, the buffer controller 226 may write data in the external buffer 230 or may read data from the external buffer 230. The memory manager 227 may communicate with the nonvolatile memory device 210 through the first channel CH1 and the second channel CH2 under control of the processor 224.

The error correction code block 228 may perform error correction encoding on data to be transmitted to the nonvolatile memory device 210 by using an error correction code ECC. The error correction code block 228 may perform error correction decoding on data received from the nonvolatile memory device 210 by using the error correction code ECC.

The processor 224 may include a short channel check controller 225. When a designated command is issued to the nonvolatile memory device 210, the short channel check controller 225 may further issue a check command directing the check operation. The designated command may include a write command, an erase command, or a read command. Alternatively, when the designated command is issued to the nonvolatile memory device 210, the short channel check controller 225 may add a descriptor/argument or an operation code directing the check operation to the designated command. In example embodiments, the short channel check controller 225 may transfer the check command, the descriptor, or the operation code to the nonvolatile memory device 210 periodically, when a count corresponding to a random number passes, or whenever the designated command is issued.

The nonvolatile memory device 210 may perform the check operation in response to the check command or in response to the descriptor or operation code directing the check operation. Alternatively, the nonvolatile memory device 210 may perform the check operation in response to the designated command. The designated command may include a write command, an erase command, or a read command. The nonvolatile memory device 210 may perform the check operation periodically, when a count corresponding to a random number passes, or whenever the designated command is received.

In example embodiments, the storage device 200 may not include the external buffer 230 and the buffer controller 226. When the external buffer 230 and the buffer controller 226 are not included in the storage device 200, the above functions of the external buffer 230 and the buffer controller 226 may be performed by the internal buffer 223.

Figure 10:
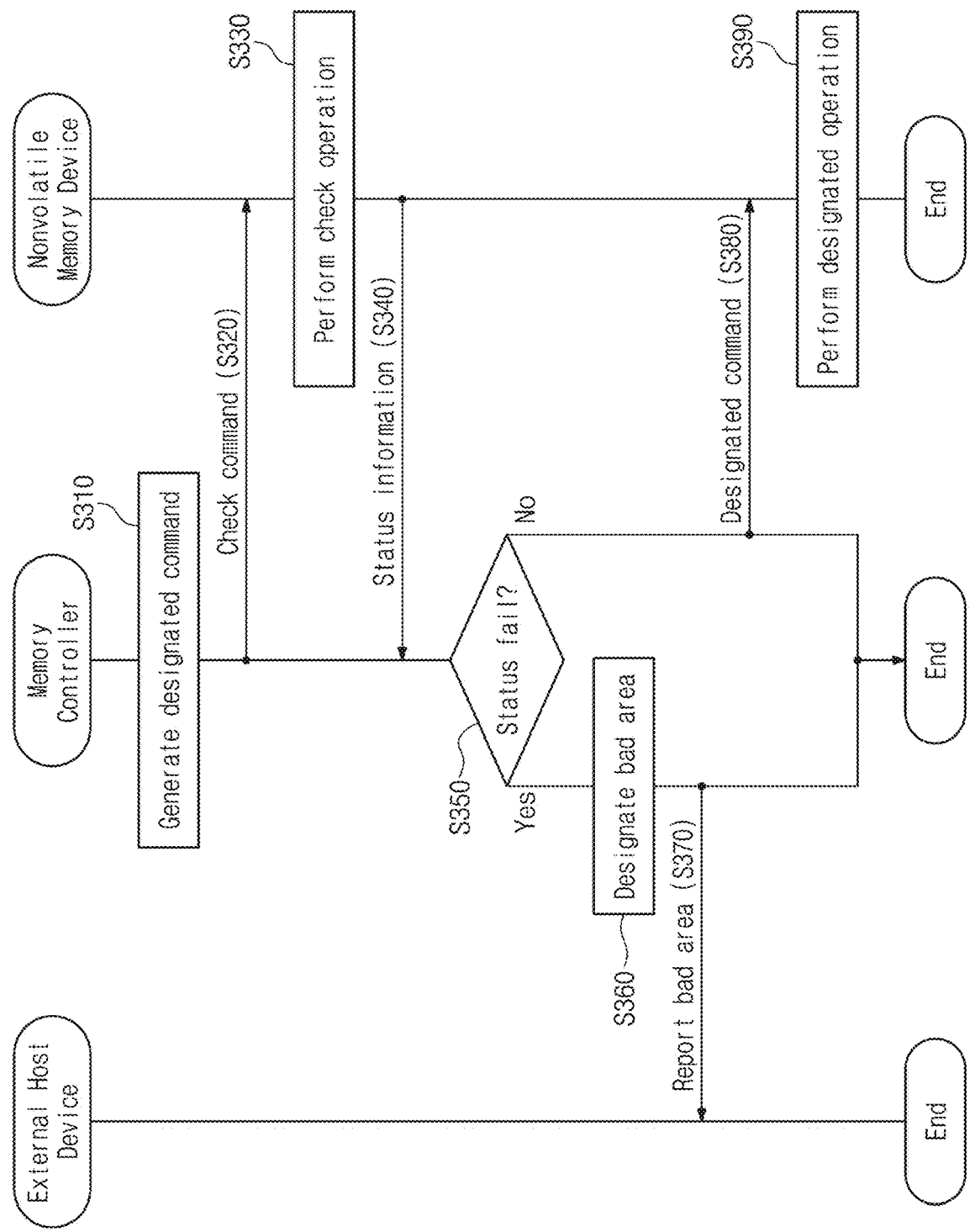
FIG. 10 illustrates a first example of an operating method of a storage device.

FIG. 10 illustrates a first example of an operating method of the storage device 200. Referring to FIGS. 9 and 10, in operation S310, the memory controller 220 may generate the designated command. The designated command may be generated depending on a request of an external host device or depending on an internal schedule. The designated command may include a write command, an erase command, or a read command.

In response to that the designated command is generated, in operation S320, the memory controller 220 may transfer the check command to the nonvolatile memory device 210. In response to the check command, in operation S330, the nonvolatile memory device 210 may perform the check command. In operation S340, the nonvolatile memory device 210 may transfer a result of the check operation to the memory controller 220 as status information.

In example embodiments, when a short-circuited channel error is detected in the check operation, the nonvolatile memory device 210 may transfer the status fail signal as the status information to the memory controller 220. When a short-circuited channel error is not detected in the check operation, the nonvolatile memory device 210 may transfer a normal status signal as the status information to the memory controller 220 or may omit the output of the status information. In example embodiments, the memory controller 220 may be configured to read the status information from the nonvolatile memory device 210 through a status read operation after transferring the check command.

When it is determined in operation S350 that the status information indicates a status fail, operation S360 is performed. In operation S360, the memory controller 220 may designate a memory block where the short-circuited channel error occurs, as a bad area. Alternatively, when a word line(s) where a short-circuited channel error occurs is identified, the memory controller 220 may designate the word line(s) where the short-circuited channel error occurs as a bad area or may designate the word line(s) where the short-circuited channel error occurs and word lines adjacent thereto as a bad area. In operation S370, the memory controller 220 may report information of the bad area to the external host device. Afterwards, the process associated with the check command and the designated command may be terminated.

When it is determined in operation S350 that the status information does not indicate a status fail, in operation S380, the memory controller 220 may transfer the designated command to the nonvolatile memory device 210. In response to the designated command, in operation S390, the nonvolatile memory device 210 may perform a designated operation. The designated operation may include a write operation, an erase operation, or a read operation. When the designated operation is completed, the process associated with the check command and the designated command may be terminated.

As described above, when the designated command is issued, the memory controller 220 may direct the nonvolatile memory device 210 to perform the check operation through the check command and may then transfer the designated command to the nonvolatile memory device 210. For example, the designated command may be the first write command for a memory block of an erase state including memory cells of the erase state. The nonvolatile memory device 100 may perform the check operation before writing, for the first time, data in a memory block including memory cells of the erase state.

Figure 11:
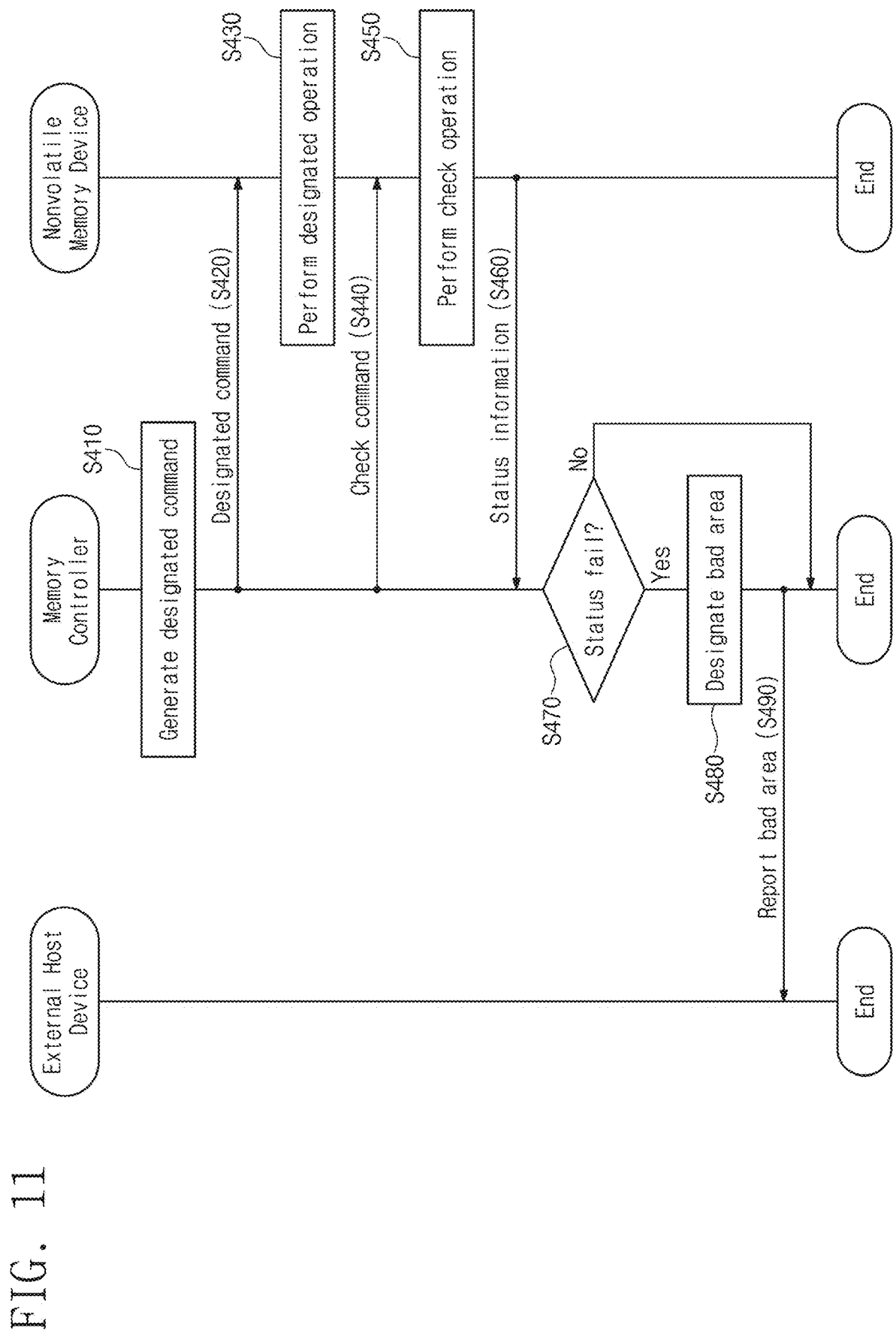
FIG. 11 illustrates a second example of an operating method of a storage device.

FIG. 11 illustrates a second example of an operating method of the storage device 200. Referring to FIGS. 9 and 11, in operation S410, the memory controller 220 may generate the designated command. The designated command may be generated depending on a request of an external host device or depending on an internal schedule. The designated command may include a write command, an erase command, or a read command.

In operation S420, the memory controller 220 may transfer the designated command to the nonvolatile memory device 210. In response to the designated command, in operation S430, the nonvolatile memory device 210 may perform a designated operation. The designated operation may include a write operation, an erase operation, or a read operation.

In response to that the designated command is completed, in operation S440, the memory controller 220 may transfer the check command to the nonvolatile memory device 210. In response to the check command, in operation S450, the nonvolatile memory device 210 may perform the check command. In operation S460, the nonvolatile memory device 210 may transfer a result of the check operation to the memory controller 220 as status information. Operation S460 may be identical to operation S340 of FIG. 10. Thus, additional description will be omitted to avoid redundancy.

When it is determined in operation S470 that the status information indicates a status fail, operation S480 is performed. In operation S480, the memory controller 220 may designate a bad area. Operation S480 may be identical to operation S360 of FIG. 10. Thus, additional description will be omitted to avoid redundancy. In operation S490, the memory controller 220 may report information of the bad area to the external host device.

When it is determined in operation S470 that the status information does not indicate a status fail, the memory controller 220 may terminate the process associated with the designated command and the check command.

As described above, when the designated command is issued, the memory controller 220 may direct the nonvolatile memory device 210 to perform the designated operation through the designated command and may then direct the nonvolatile memory device 210 to perform the check operation through the check command. For example, the designated command may be an erase command for erasing memory cells of a memory block. The nonvolatile memory device 210 may erase memory cells of a memory block and may then perform the check operation.

Figure 12:
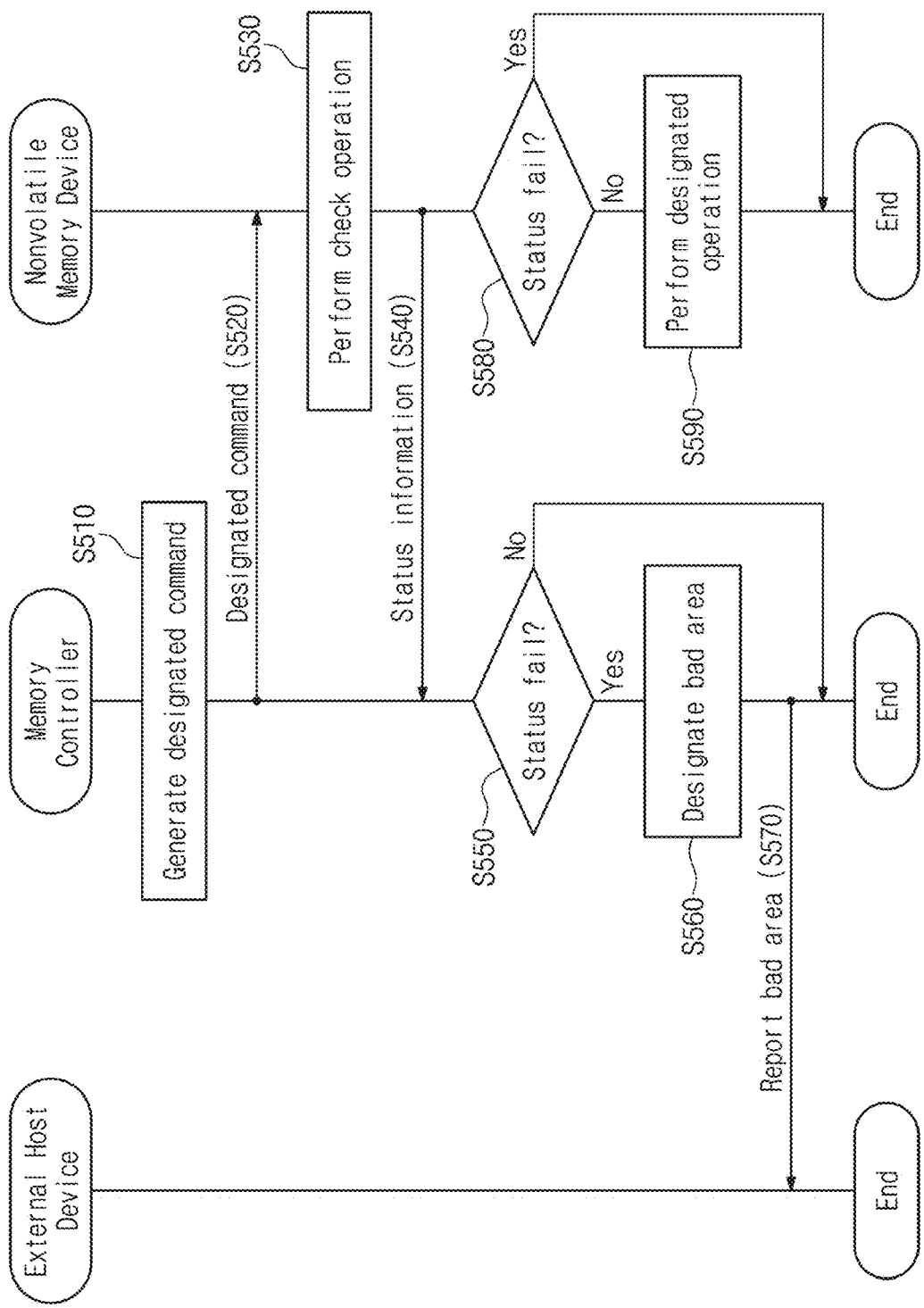
FIG. 12 illustrates a third example of an operating method of a storage device.

FIG. 12 illustrates a third example of an operating method of the storage device 200. Referring to FIGS. 9 and 12, in operation S510, the memory controller 220 may generate the designated command. The designated command may be generated depending on a request of an external host device or depending on an internal schedule. The designated command may include a write command, an erase command, or a read command. The designated command may include a descriptor/argument or an operation code indicating the check operation.

In operation S520, the memory controller 220 may transfer the designated command to the nonvolatile memory device 210. In response to the designated command, in operation S530, the nonvolatile memory device 210 may perform the check operation. In operation S540, the nonvolatile memory device 210 may transfer a result of the check operation to the memory controller 220 as status information. Operation S540 may be identical to operation S340 of FIG. 10. Thus, additional description will be omitted to avoid redundancy.

When it is determined in operation S550 that the status information indicates a status fail, operation S560 is performed. In operation S560, the memory controller 220 may designate a bad area. Operation S560 may be identical to operation S360 of FIG. 10. Thus, additional description will be omitted to avoid redundancy. In operation S570, the memory controller 220 may report information of the bad area to the external host device. Afterwards, the process associated with the designated command may be terminated.

When it is determined in operation S550 that the status information does not indicate a status fail, the process associated with the check operation is terminated. In parallel with operation S550, in operation S580, when the status information indicates a status fail, the process associated with the designated command is terminated. When it is determined in operation S580 that the status information does not indicate a status fail, operation S590 is performed.

In operation S590, in response to that the check operation initiated according to the designated command is completed, the nonvolatile memory device 210 may perform a designated operation. The designated operation may include a write operation, an erase operation, or a read operation. Afterwards, the memory controller 220 may terminate the process associated with the designated command and the check command.

As described above, when the designated command is issued, the memory controller 220 may include the descriptor/argument or operation code indicating the check operation in the designated command. In response to the designated command including the descriptor/argument or operation code indicating the check operation, the nonvolatile memory device 210 may perform the check operation; when an error is not detected in the check operation, the nonvolatile memory device 210 may perform a designated operation. For example, the designated command may be the first write command for a memory block of an erase state including memory cells of the erase state. The nonvolatile memory device 210 may perform the check operation before writing, for the first time, data in a memory block including memory cells of the erase state.

Figure 13:
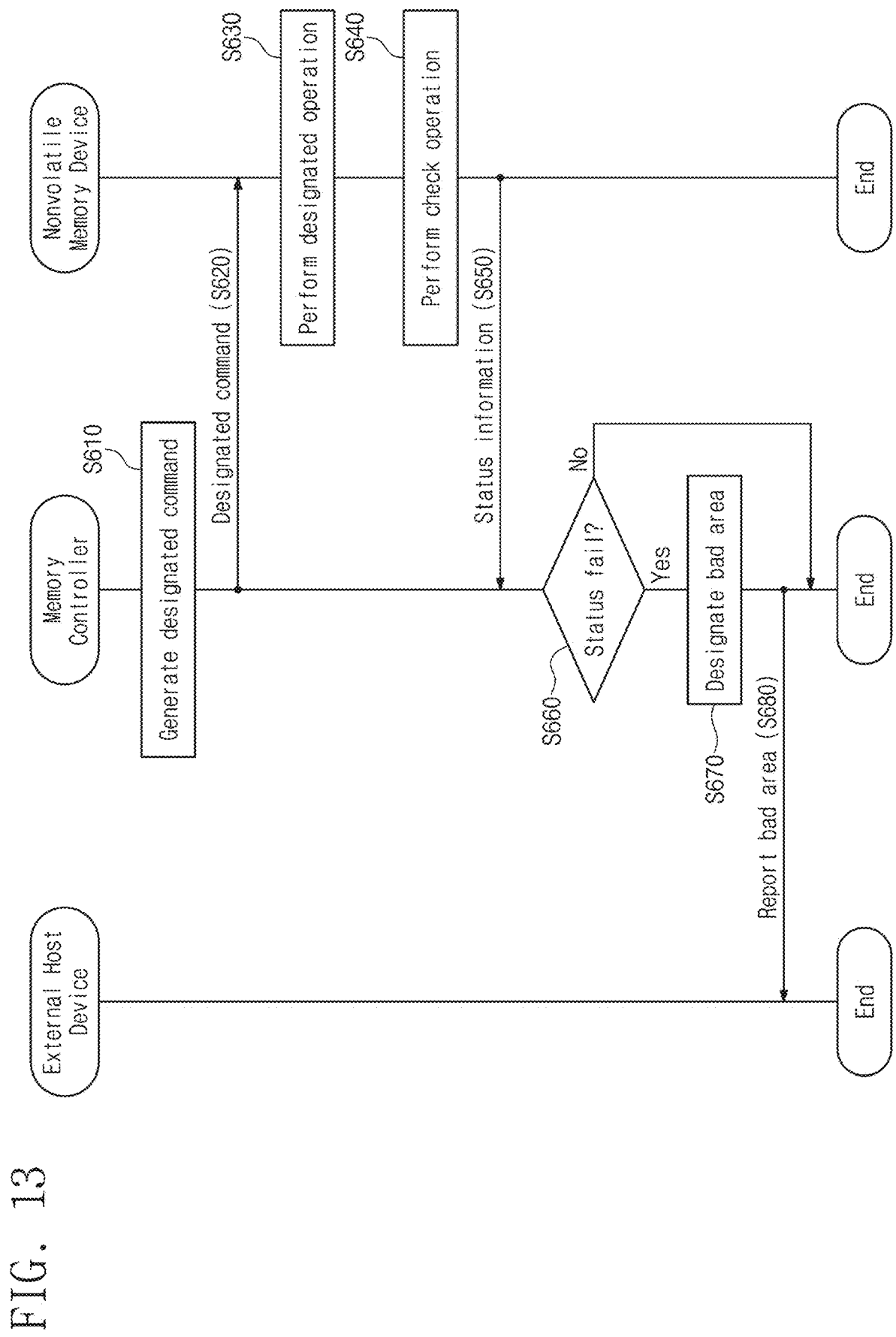
FIG. 13 illustrates a fourth example of an operating method of a storage device.

FIG. 13 illustrates a fourth example of an operating method of the storage device 200. Referring to FIGS. 9 and 13, in operation S610, the memory controller 220 may generate the designated command. The designated command may be generated depending on a request of an external host device or depending on an internal schedule. The designated command may include a write command, an erase command, or a read command. The designated command may include a descriptor/argument or an operation code indicating the check operation.

In operation S620, the memory controller 220 may transfer the designated command to the nonvolatile memory device 210. In response to the designated command, in operation S630, the nonvolatile memory device 210 may perform a designated operation. The designated operation may include a write operation, an erase operation, or a read operation.

In operation S640, in response to that the designated operation initiated according to the designated command is completed, the nonvolatile memory device 210 may perform the check operation. In operation S650, the nonvolatile memory device 210 may transfer a result of the check operation to the memory controller 220 as status information. Operation S650 may be identical to operation S340 of FIG. 10. Thus, additional description will be omitted to avoid redundancy.

When it is determined in operation S660 that the status information indicates a status fail, operation S670 is performed. In operation S670, the memory controller 220 may designate a bad area. Operation S670 may be identical to operation S360 of FIG. 10. Thus, additional description will be omitted to avoid redundancy. In operation S680, the memory controller 220 may report information of the bad area to the external host device. Afterwards, the process associated with the designated command is terminated.

When it is determined in operation S660 that the status information does not indicate a status fail, the process associated with the designated command may be terminated.

As described above, when the designated command is issued, the memory controller 220 may include the descriptor/argument or operation code indicating the check operation in the designated command. In response to the designated command including the descriptor/argument or operation code indicating the check operation, the nonvolatile memory device 210 may perform the designated operation and may perform the check operation. For example, the designated command may be an erase command for erasing memory cells of a memory block. The nonvolatile memory device 210 may erase memory cells of a memory block and may then perform the check operation.

Figure 14:
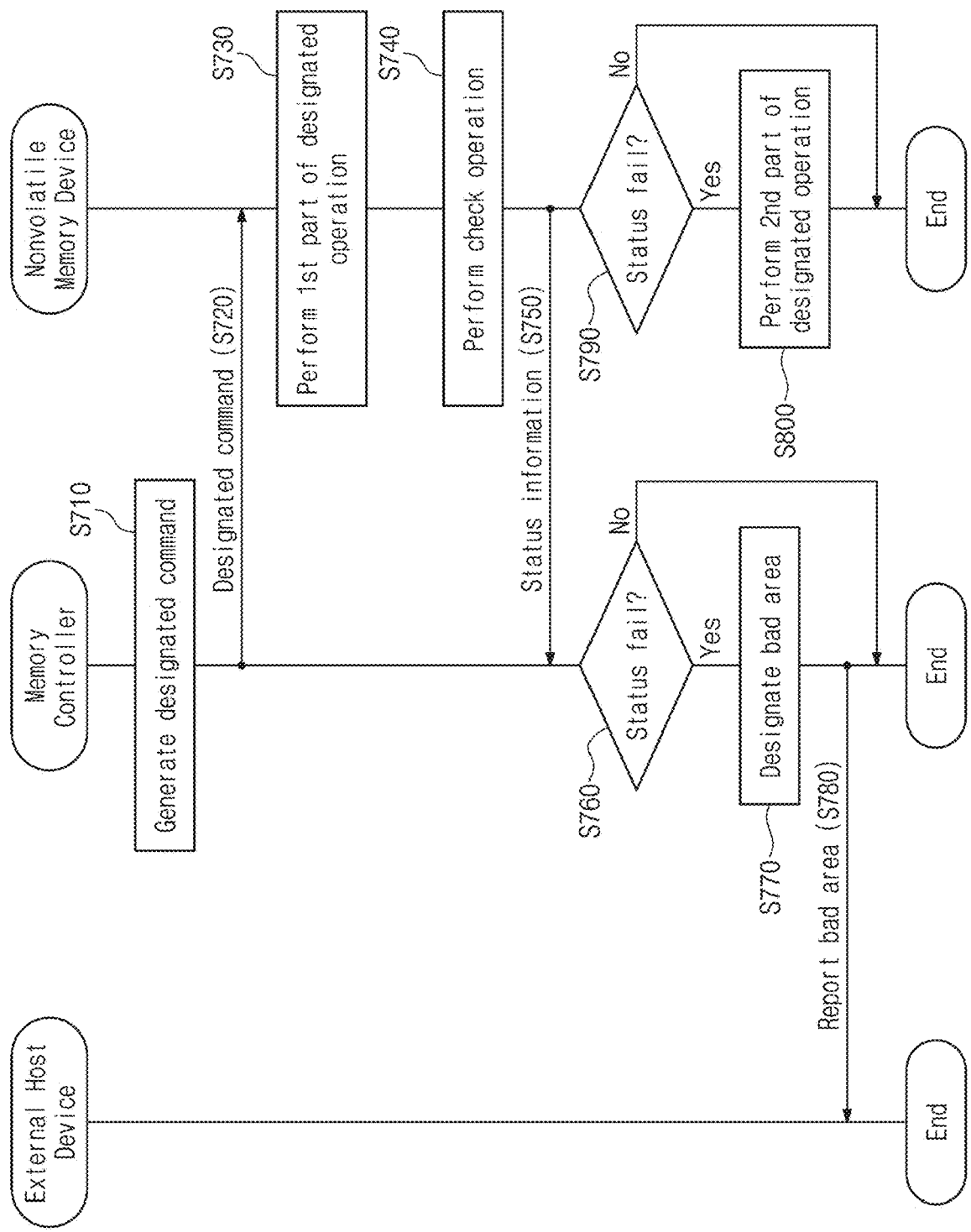
FIG. 14 illustrates a fifth example of an operating method of a storage device.

FIG. 14 illustrates a fifth example of an operating method of the storage device 200. Referring to FIGS. 9 and 14, in operation S710, the memory controller 220 may generate the designated command. The designated command may be generated depending on a request of an external host device or depending on an internal schedule. The designated command may include a write command, an erase command, or a read command. The designated command may include a descriptor/argument or an operation code indicating the check operation.

In operation S720, the memory controller 220 may transfer the designated command to the nonvolatile memory device 210. In response to the designated command, in operation S730, the nonvolatile memory device 210 may perform a first part of a designated operation. The designated operation may include a write operation, an erase operation, or a read operation.

In operation S740, in response to that the first part of the designated operation initiated according to the designated command is completed, the nonvolatile memory device 210 may perform the check operation. In operation S750, the nonvolatile memory device 210 may transfer a result of the check operation to the memory controller 220 as status information. Operation S750 may be identical to operation S340 of FIG. 10. Thus, additional description will be omitted to avoid redundancy.

When it is determined in operation S760 that the status information indicates a status fail, operation S770 is performed. In operation S770, the memory controller 220 may designate a bad area. Operation S770 may be identical to operation S360 of FIG. 10. Thus, additional description will be omitted to avoid redundancy. In operation S780, the memory controller 220 may report information of the bad area to the external host device. Afterwards, the process associated with the designated command is terminated.

In parallel with operation S760, in operation S790, when the status information indicates a status fail, the process associated with the designated command is terminated. When it is determined in operation S790 that the status information does not indicate a status fail, operation S800 is performed.

In operation S800, in response to that the check operation initiated according to the designated command is completed, the nonvolatile memory device 210 may perform a second part of the designated operation. Afterwards, the memory controller 220 may terminate the process associated with the designated command and the check command.

As described above, when the designated command is issued, the memory controller 220 may include the descriptor/argument or operation code indicating the check operation in the designated command. In response to the designated command including the descriptor/argument or operation code indicating the check operation, the nonvolatile memory device 210 may perform the first part of the designated operation, may perform the check operation, and may perform the second part of the designated operation.

Figure 15:
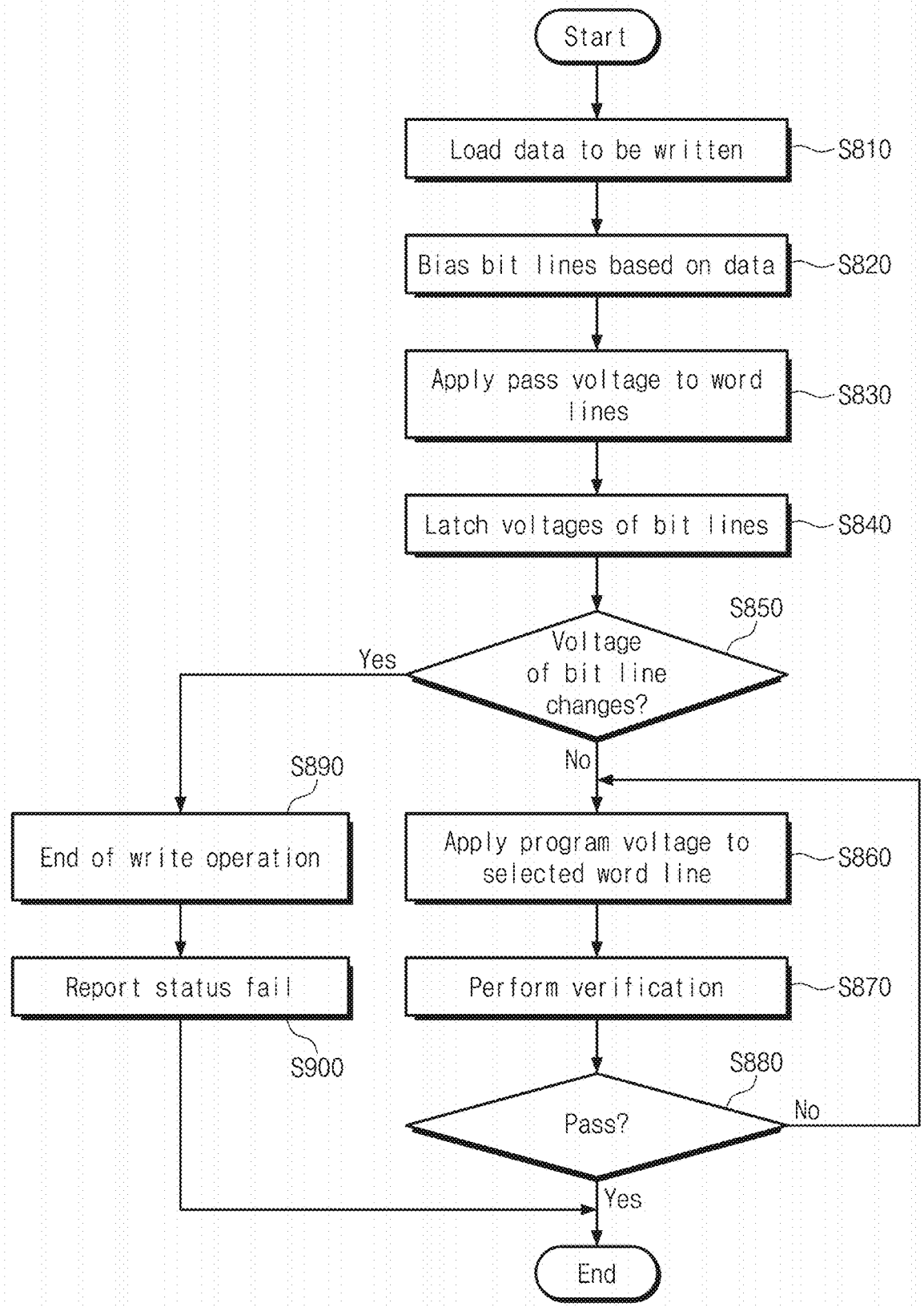
FIG. 15 illustrates a sixth example of an operating method of a storage device.

FIG. 15 illustrates a sixth example of an operating method of the storage device 200. Referring to FIGS. 1, 2, 9, and 15, the nonvolatile memory device 100 may receive a write command as the designated command. The write command may be received together with an address and data.

In operation S810, the nonvolatile memory device 100 may load the received data onto the page buffer 130. Operation S810 may belong to a write operation.

In operation S820, the page buffer 130 may bias the bit lines BL1 and BL2 based on the loaded data. For example, the page buffer 130 may apply a voltage of a second logical level (e.g., a ground voltage) to a bit line corresponding to a memory cell to be programmed. The page buffer 130 may apply a voltage of a first logical level (e.g., a power supply voltage) to a bit line corresponding to a memory cell to be program-inhibited. Operation S820 may belong to the write operation. Also, operation S820 may correspond to an operation of applying the bias voltage VBA of the check operation.

In operation S830, the row decoder 120 may apply a turn-off voltage to the ground selection line GSL. The row decoder 120 may apply a pass voltage to the string selection lines SSL1*a*, SSL1*b*, SSL2*a*, and SSL2*b*. The row decoder 120 may apply the pass voltage to the word lines WL1 to WL8. The pass voltage may be a voltage sufficient to turn on the memory cells MC1 to MC8 and the string selection transistors SSTa and SSTb. Operation S830 may belong to the write operation. Also, operation S830 may correspond to an operation of applying the turn-on voltage VON, the turn-off voltage VOFF, and the check voltage VCK in the check operation. Operation S820 and operation S830 may constitute the first time period of the check operation.

In operation S840, the page buffer 130 may sense voltages of the bit lines BL1 and BL2. In operation S850, the control logic 170 may determine whether the voltages of the bit lines BL1 and BL2 change. Operation S840 and operation S850 may constitute the second time period of the check operation. Operation S820 to operation S850 may correspond to the first phase of the check operation.

In response to that a determination result in operation S850 indicates that the voltages of the bit lines BL1 and BL2 do not change, in operation S860, the row decoder 120 may apply a program voltage to a selected word line. Operation S860 may belong to the write operation.

In operation S870, the nonvolatile memory device 100 may perform a verification operation. The page buffer 130 may precharge the bit lines BL1 and BL2 to a positive voltage and may then float the bit lines BL1 and BL2. The row decoder 120 may apply a read pass voltage to unselected word lines, the ground selection line GSL, and the string selection lines SSL1*a*, SSL1*b*, SSL2*a*, and SSL2*b*. The read pass voltage may be a voltage sufficient to turn on the ground selection transistor GST, the string selection transistors SSTa and SSTb, and unselected memory cells. The row decoder 120 may apply a verification voltage to the selected word line. After a develop time passes, the page buffer 130 may latch voltages of the bit lines BL1 and BL2.

In operation S880, the control logic 170 may determine whether memory cells of the selected word line are program passed. When threshold voltages of the selected memory cells are the verification voltage or more, the control logic 170 may determine a pass. In response to that a program fail is determined, the nonvolatile memory device 100 may again perform operation S860. In response to that a program pass is determined, a process of the write operation may be terminated.

Figure 16:
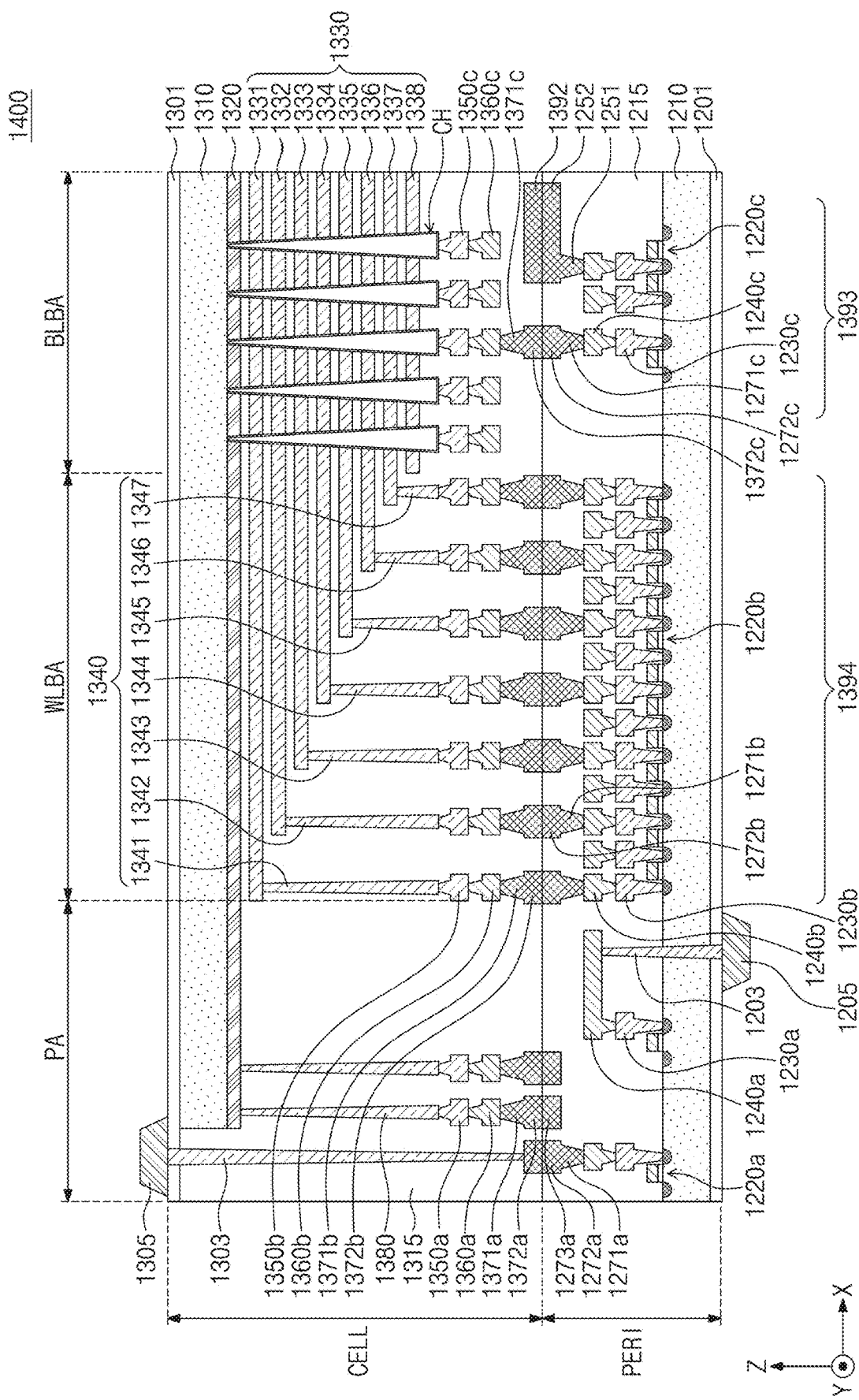
FIG. 16 is a diagram illustrating a memory device according to example embodiments of the present disclosure.

In response to that the determination result in operation S850 indicates that a voltage of at least one of the bit lines BL1 and BL2 changes, in operation S890, the nonvolatile memory device 100 may terminate the write operation. For example, the nonvolatile memory device 100 may further perform the second phase of the check operation described with reference to FIG. 8. When it is determined that a short-circuited channel error occurs, in operation S900, the nonvolatile memory device 100 may report a status fail to the memory controller 220. Afterwards, the process associated with the write operation may be terminated FIG. 16 is a diagram illustrating a memory device according to example embodiments of the present disclosure. Referring to FIG. 16, a memory device 1400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals are formed of copper (Cu), the bonding manner may be a Cu—Cu bonding, and the bonding metals may also be formed of aluminum or tungsten.

Each of the peripheral circuit region PERI and the cell region CELL of the memory device 1400 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 1240a, 1240b, and 1240c formed on the first metal layers 1230a, 1230b, and 1230c. In example embodiments, the first metal layers 1230a, 1230b, and 1230c may be formed of tungsten having a relatively high resistance, and the second metal layers 1240a, 1240b, and 1240c may be formed of copper having a relatively low resistance.

In example embodiments illustrated in FIG. 19, even though the first metal layers 1230a, 1230b, and 1230c and the second metal layers 1240a, 1240b, and 1240c are shown and described, the first metal layers 1230a, 1230b, and 1230c and the second metal layers 1240a, 1240b, and 1240c are not limited thereto, and one or more metal layers may be further formed on the second metal layers 1240a, 1240b, and 1240c. At least a part of the one or more metal layers formed on the second metal layers 1240a, 1240b, and 1240c may be formed of aluminum or the like having a lower resistance than those of copper forming the second metal layers 1240a, 1240b, and 1240c.

The interlayer insulating layer 1215 may be disposed on the first substrate 1210 and may cover the plurality of circuit elements 1220a, 1220b, and 1220c, the first metal layers 1230a, 1230b, and 1230c, and the second metal layers 1240a, 1240b, and 1240c. The interlayer insulating layer 1215 may include an insulating material such as silicon oxide, silicon nitride, or the like.

Lower bonding metals 1271b and 1272b may be formed on the second metal layer 1240b in the word line bonding area WLBA. In the word line bonding area WLBA, the lower bonding metals 1271b and 1272b in the peripheral circuit region PERI may be electrically connected to upper bonding metals 1371b and 1372b in the cell region CELL in a bonding manner, and the lower bonding metals 1271b and 1272b and the upper bonding metals 1371b and 1372b may be formed of aluminum, copper, tungsten, or the like.

Also, the upper bonding metals 1371b and 1372b in the cell region CELL may be referred as first metal pads, and the lower bonding metals 1271b and 1272b in the peripheral circuit region PERI may be referred as second metal pads.

The cell region CELL may include at least one memory block. The cell region CELL may include a second substrate 1310, an interlayer insulating layer 1315, and a common source line 1320. On the second substrate 1310, a plurality of word lines 1331 to 1338 (e.g., 1330) may be stacked in a direction (e.g., a Z-axis direction) perpendicular to an upper surface of the second substrate 1310. String selection lines and a ground selection line may be arranged on and below the plurality of word lines 1330, respectively, and the plurality of word lines 1330 may be disposed between the string selection lines and the ground selection line.

Widths of the plurality of word lines 1330 in the X-axis direction may be different. As a distance from the first substrate 1210 of the peripheral circuit region PERI to the corresponding one of the plurality of word lines 1300 increases, a width of the corresponding one of the plurality of word lines 1330 increases. Likewise, as a distance from the second substrate 1310 of the cell region CELL to the corresponding one of the plurality of word lines 1300 increases, a width of the corresponding one of the plurality of word lines 1330 decreases.

In the bit line bonding area BLBA, a channel structure CH may extend in a direction perpendicular to the upper surface of the second substrate 1310 and may pass through the plurality of word lines 1330, the string selection lines, and the ground selection line. The channel structure CH may include a data storage layer, a channel layer, a buried insulating layer, and the like, and the channel layer may be electrically connected to a first metal layer 1350c and a second metal layer 1360c. For example, the first metal layer 1350c may be a bit line contact, and the second metal layer 1360c may be a bit line. In example embodiments, the bit line 1360c may extend in a first direction (e.g., a Y-axis direction) parallel to the upper surface of the second substrate 1310.

The interlayer insulating layer 1315 may be disposed on the second substrate 1310 and may cover the common source line 1320, the plurality of word lines 1330, the plurality of cell contact plugs 1340, the first metal layers 1350a, 1350b, and 1350c, and the second metal layers 1360a, 1360b, and 1360c. The interlayer insulating layer 1315 may include an insulating material such as silicon oxide, silicon nitride, or the like.

In example embodiments illustrated in FIG. 16, an area in which the channel structure CH, the bit line 1360c, and the like are disposed may be defined as the bit line bonding area BLBA. In the bit line bonding area BLBA, the bit line 1360c may be electrically connected to the circuit elements 1220c providing a page buffer 1393 in the peripheral circuit region PERI. For example, the bit line 1360c may be connected to upper bonding metals 1371c and 1372c in the cell region CELL, and the upper bonding metals 1371c and 1372c may be connected to lower bonding metals 1271c and 1272c connected to the circuit elements 1220c of a page buffer 1393.

In the word line bonding area WLBA, the plurality of word lines 1330 may extend in a second direction (e.g., an X-axis direction) parallel to the upper surface of the second substrate 1310 and may be connected to a plurality of cell contact plugs 1341 to 1347 (e.g., 1340). The word lines 1330 and the cell contact plugs 1340 may be connected to each other at pads provided by at least some of the plurality of word lines 1330, which extend in the second direction with different lengths. A first metal layer 1350b and a second metal layer 1360b may be sequentially connected to an upper portion of each of the cell contact plugs 1340 connected to the word lines 1330. The cell contact plugs 1340 may be connected to the peripheral circuit region PERI by the upper bonding metals 1371b and 1372b of the cell region CELL and the lower bonding metals 1271b and 1272b of the peripheral circuit region PERI in the word line bonding area WLBA.

The cell contact plugs 1340 may be electrically connected to the circuit elements 1220b providing a row decoder 1394 in the peripheral circuit region PERI. In example embodiments, operating voltages of the circuit elements 1220b providing the row decoder 1394 may be different than operating voltages of the circuit elements 1220c providing the page buffer 1393. For example, operating voltages of the circuit elements 1220c providing the page buffer 1393 may be greater than operating voltages of the circuit elements 1220b providing the row decoder 1394.

A common source line contact plug 1380 may be disposed in the external pad bonding area PA. The common source line contact plug 1380 may be formed of a conductive material such as a metal, a metal compound, polysilicon, or the like and may be electrically connected to the common source line 1320. A first metal layer 1350a and a second metal layer 1360a may be sequentially stacked on an upper portion of the common source line contact plug 1380. For example, an area in which the common source line contact plug 1380, the first metal layer 1350a, and the second metal layer 1360a are disposed may be defined as the external pad bonding area PA.

Input/output pads 1205 and 1305 may be disposed in the external pad bonding area PA. Referring to FIG. 16, a lower insulating film 1201 covering a lower surface of the first substrate 1210 may be formed below the first substrate 1210, and the first input/output pad 1205 may be formed on the lower insulating film 1201. The first input/output pad 1205 may be connected to at least one of the plurality of circuit elements 1220a, 1220b, and 1220c disposed in the peripheral circuit region PERI through a first input/output contact plug 1203 and may be separated from the first substrate 1210 by the lower insulating film 1201. In addition, a side insulating film may be disposed between the first input/output contact plug 1203 and the first substrate 1210 to electrically separate the first input/output contact plug 1203 and the first substrate 1210.

Referring to FIG. 16, an upper insulating film 1301 covering the upper surface of the second substrate 1310 may be formed on the second substrate 1310, and the second input/output pad 1305 may be disposed on the upper insulating film 1301. The second input/output pad 1305 may be connected to at least one of the plurality of circuit elements 1220a, 1220b, and 1220c disposed in the peripheral circuit region PERI through a second input/output contact plug 1303 and the lower bonding metals 1271a and 1272a of the peripheral circuit region PERI.

According to example embodiments, the second substrate 1310 and the common source line 1320 may not be disposed in an area in which the second input/output contact plug 1303 is disposed. Also, the second input/output pad 1305 may not overlap the word lines 1330 in the third direction (e.g., the Z-axis direction). Referring to FIG. 16, the second input/output contact plug 1303 may be separated from the second substrate 1310 in a direction parallel to the upper surface of the second substrate 1310 and may pass through the interlayer insulating layer 1315 of the cell region CELL to be connected to the second input/output pad 1305.

According to example embodiments, the first input/output pad 1205 and the second input/output pad 1305 may be selectively formed. For example, the memory device 1400 may include only the first input/output pad 1205 disposed on the first substrate 1210 or the second input/output pad 1305 disposed on the second substrate 1310. Alternatively, the memory device 1400 may include both the first input/output pad 1205 and the second input/output pad 1305.

A metal pattern in an uppermost metal layer may be provided as a dummy pattern or the uppermost metal layer may be absent, in each of the external pad bonding area PA and the bit line bonding area BLBA respectively included in the cell region CELL and the peripheral circuit region PERI.

In the external pad bonding area PA, the memory device 1400 may include a lower metal pattern 1273a, which corresponds to an upper metal pattern 1372a formed in an uppermost metal layer of the cell region CELL and has the same shape as the upper metal pattern 1372a of the cell region CELL, in an uppermost metal layer of the peripheral circuit region PERI. In the peripheral circuit region PERI, the lower metal pattern 1273a formed in the uppermost metal layer of the peripheral circuit region PERI may not be connected to a contact. As in the above description, in the external pad bonding area PA, an upper metal pattern which corresponds to the lower metal pattern formed in an uppermost metal layer of the peripheral circuit region PERI and has the same shape as a lower metal pattern of the peripheral circuit region PERI, may be formed in an uppermost metal layer of the cell region CELL.

The lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a bonding scheme.

Also, the bit line bonding area BLBA, an upper metal pattern 1392, which corresponds to a lower metal pattern 1252 formed in the uppermost metal layer of the peripheral circuit region PERI and has the same shape as the lower metal pattern 1252 of the peripheral circuit region PERI, may be formed in an uppermost metal layer of the cell region CELL. A contact may not be formed on the upper metal pattern 1392 formed in the uppermost metal layer of the cell region CELL.

In the above example embodiments, components according to the present disclosure are described by using the terms "first", "second", "third", and the like. However, the terms "first", "second", "third", and the like may be used to distinguish components from each other and do not limit the present disclosure. For example, the terms "first", "second", "third", and the like do not involve an order or a numerical meaning of any form.

In the above example embodiments, components according to example embodiments of the present disclosure are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the present disclosure, a nonvolatile memory device may check that a channel failure occurs. Accordingly, a nonvolatile memory device with improved reliability and a storage device including the nonvolatile memory device are provided.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. A nonvolatile memory device comprising:
a memory cell array including cell strings, wherein each of the cell strings includes a ground selection transistor, memory cells, and a string selection transistor stacked in a direction perpendicular to a substrate;
a row decoder connected with the ground selection transistor of each of the cell strings through a ground selection line, connected with the memory cells of each of the cell strings through word lines, and connected with the string selection transistor of each of the cell strings through a string selection line; and
a page buffer connected with the cell strings through bit lines,
wherein, in a first period of a check operation, the page buffer is configured to apply a first bias voltage to the bit lines, wherein, in the first period of the check operation, the row decoder is configured to apply a turn-off voltage to the ground selection line, to apply a turn-on voltage to the string selection line, and to apply a first check voltage to the word lines, wherein, in a second period of the check operation, the page buffer is configured to sense first changes of voltages of the bit lines, and wherein, in the second period of the check operation, a status fail signal is output in response to that the first changes of the voltages of the bit lines are sensed.

2. The nonvolatile memory device of claim 1, wherein the first bias voltage is a positive voltage, and wherein the first check voltage is smaller than the first bias voltage.

3. The nonvolatile memory device of claim 2, wherein, in the second period of the check operation, the page buffer outputs the status fail signal in response to that the voltages of the bit lines decrease.

4. The nonvolatile memory device of claim 2, wherein, in the second period of the check operation, the page buffer floats the bit lines during a first time period and then senses the first changes of the voltages of the bit lines.

5. The nonvolatile memory device of claim 1, wherein the first check voltage is greater than the first bias voltage.

6. The nonvolatile memory device of claim 5, wherein, in the second period of the check operation, the nonvolatile memory device outputs the status fail signal in response to that the voltages of the bit lines increase.

7. The nonvolatile memory device of claim 1, wherein, in response to that no voltages of the bit lines change, the check operation is terminated without an output of the status fail signal.

8. The nonvolatile memory device of claim 1, wherein, in a third period of the check operation, the page buffer applies a second bias voltage to the bit lines, wherein, in the third period of the check operation, the row decoder applies the turn-off voltage to the ground selection line, applies the turn-on voltage to the string selection line, and applies a second check voltage to the word lines, and wherein, in a fourth period of the check operation, the page buffer senses second changes of the voltages of the bit lines.

9. The nonvolatile memory device of claim 8, wherein the second check voltage is equal to the second bias voltage.

10. The nonvolatile memory device of claim 8, wherein, in response to that a number of first bit lines, at which the first changes are made, from among the bit lines is equal to a number of second bit lines, at which the second changes are made, from among the bit lines, an output of the status fail signal is omitted.

11. A storage device comprising:
a nonvolatile memory device including cell strings, wherein each of the cell strings includes a ground selection transistor, memory cells, and a string selection transistor stacked on a substrate in a direction perpendicular to the substrate; and
a controller configured to transfer a command to the nonvolatile memory device, wherein the nonvolatile memory device performs a check operation in response to the command,
wherein the check operation includes:
a first period of applying a bias voltage to bit lines connected with the cell strings, applying a turn-off voltage to a ground selection line connected with the ground selection transistor of each of the cell strings, applying a turn-on voltage to a string selection line connected with the string selection transistor of each of the cell strings, and applying a check voltage to word lines connected with the memory cells of each of the cell strings; and
a second period of sensing changes of voltages of the bit lines.

12. The storage device of claim 11, wherein, in response to that the changes of the voltages of the bit lines are sensed, the nonvolatile memory device transfers a status fail signal to the controller.

13. The storage device of claim 11, wherein the controller is further configured to transfer the command to the nonvolatile memory device before transferring a designated command to the nonvolatile memory device, and wherein the designated command includes at least one of a write command, a read command, or an erase command.

14. The storage device of claim 11, wherein the controller is further configured to transfer the command to the nonvolatile memory device after transferring a designated command to the nonvolatile memory device, and wherein the designated command includes at least one of a write command, a read command, or an erase command.

15. The storage device of claim 11, wherein the command is one of a write command, a read command, or an erase command, and wherein, in response to the command, the nonvolatile memory device performs the check operation and then performs an operation designated by the command from among a write operation, a read operation, or an erase operation.

16. The storage device of claim 11, wherein the command is one of a write command, a read command, or an erase command, and wherein, in response to the command, the nonvolatile memory device performs an operation designated by the command from among a write operation, a read operation, or an erase operation and then performs the check operation.

17. The storage device of claim 11, wherein the command is one of a write command, a read command, or an erase command, and wherein, in response to the command, the nonvolatile memory device performs a part of an operation designated by the command from among a write operation, a read operation, or an erase operation, then performs the check operation, and then performs the remaining part of the designated operation.

18. The storage device of claim 11, wherein the command is a write command, and wherein the nonvolatile memory device receives write data together with the command, applies voltages including the bias voltage to the bit lines based on the write data, applies a pass voltage to the word lines as the check voltage, suspends a write operation according to the write command in response to that voltages of bit lines to which the bias voltage is applied change, and applies a program voltage to a word line selected from the word lines in response to that no voltages of the bit lines to which the bias voltage is applied change.

19. A nonvolatile memory device comprising:
a peripheral region; and
a memory cell region,
wherein the memory cell region includes:
first metal pads; and a memory cell array including cell strings, wherein each of the cell strings includes a ground selection transistor, memory cells, and a string selection transistor stacked on a substrate in a direction perpendicular to the substrate, wherein the peripheral region includes:

second metal pads;

a row decoder connected with the ground selection transistor of each of the cell strings through a ground selection line, connected with the memory cells of each of the cell strings through word lines, and connected with the string selection transistor of each of the cell strings through a string selection line; and a page buffer connected with the cell strings through bit lines, wherein the peripheral region is vertically connected by the first metal pads and the second metal pads, wherein, in a first period of a check operation, the page buffer is configured to apply a bias voltage to the bit lines, wherein, in the first period of the check operation, the row decoder is configured to apply a turn-off voltage to the ground selection line, to apply a turn-on voltage to the string selection line, and to apply a check voltage to the word lines, wherein, in a second period of the check operation, the page buffer is configured to sense changes of voltages of the bit lines, and wherein, in the second period of the check operation, a status fail signal is output in response to that the changes of the voltages of the bit lines are sensed.

20. The nonvolatile memory device of claim 19, wherein the row decoder is connected with the ground selection line, the string selection line, and the word lines through a first part of the first metal pads and a first part of the second metal pads, and wherein the page buffer is connected with the bit lines through a second part of the first metal pads and a second part of the second metal pads.

\* \* \* \* \*